United States Patent
Jin et al.

(12) 
(10) Patent No.: US 6,350,665 B1
(45) Date of Patent: Feb. 26, 2002

(54) SEMICONDUCTOR STRUCTURE AND METHOD OF MAKING CONTACTS AND SOURCE AND/OR DRAIN JUNCTIONS IN A SEMICONDUCTOR DEVICE

(75) Inventors: Bo Jin, Campbell; Jianmin Qiao, Fremont, both of CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/561,292

(22) Filed: Apr. 28, 2000

(51) Int. Cl.[7] .................. H01L 21/3205; H01L 21/4763
(52) U.S. Cl. ...................... 438/585; 438/587; 438/305
(58) Field of Search ............................... 438/585, 592, 438/305, 587

(56) References Cited

U.S. PATENT DOCUMENTS

| | | |
|---|---|---|
| 4,745,086 A | 5/1988 | Parrillo et al. |
| 4,818,714 A | 4/1989 | Haskell |
| 5,278,441 A | 1/1994 | Kang et al. |
| 5,460,993 A | 10/1995 | Hsu et al. |
| 5,583,067 A | 12/1996 | Sanchez |
| 5,654,212 A | 8/1997 | Jang |
| 5,763,312 A | 6/1998 | Jeng et al. |
| 5,766,991 A | 6/1998 | Chen |
| 5,801,077 A | 9/1998 | Chor et al. |
| 5,811,342 A | 9/1998 | Wu |
| 5,837,572 A | 11/1998 | Gardner et al. |
| 5,846,857 A | 12/1998 | Ju |
| 5,851,866 A | 12/1998 | Son |
| 5,866,460 A | 2/1999 | Akram |
| 5,899,722 A | 5/1999 | Huang |
| 5,943,565 A | 8/1999 | Ju |
| 5,989,966 A | 11/1999 | Huang |
| 5,998,274 A | 12/1999 | Akram et al. |
| 6,004,851 A | 12/1999 | Peng |
| 6,020,232 A | 2/2000 | Gardner et al. |
| 6,033,962 A | 3/2000 | Jeng et al. |
| 6,043,116 A | 3/2000 | Kuo |
| 6,077,763 A * | 6/2000 | Chen et al. .................. 438/595 |
| 6,103,608 A * | 8/2000 | Jen et al. ..................... 438/592 |

* cited by examiner

*Primary Examiner*—Richard Booth
(74) *Attorney, Agent, or Firm*—Bradley T. Sako

(57) ABSTRACT

According to one embodiment (100), a method of manufacturing a semiconductor device may include forming diffusion regions in a substrate with a gate, first spacer, and second spacer as a diffusion mask (102). A second spacer may then be removed (104) prior to the formation of an interlayer dielectric. An interlayer dielectric may then be formed (106) over a gate structure and first spacer. A contact hole may then be etched through the interlayer dielectric that is self-aligned with the gate (108).

20 Claims, 17 Drawing Sheets

2

SEMICONDUCTOR STRUCTURE AND METHOD OF MAKING CONTACTS AND SOURCE AND/OR DRAIN JUNCTIONS IN A SEMICONDUCTOR DEVICE

TECHNICAL FIELD

The present invention relates generally to the fabrication of integrated circuits, and more particularly to the formation of contacts and/or diffusion regions in an integrated circuit.

BACKGROUND OF THE INVENTION

Most integrated circuit (IC) manufacturing processes typically include a number of manufacturing steps that can sequentially form, shape or otherwise modify various layers. Typically devices can be formed in a semiconductor substrate having regions doped for varying conductivity. Electrical connections between a substrate and/or various other layers may be accomplished by way of contact structures, including conductive vias.

One concern with the formation of contact structures can be the resulting resistance presented by a contact structure. As contact resistance increases semiconductor device speed can slow down. Because system speeds continue rise, lowering contact resistance continues to be a goal for many integrated circuit manufacturers.

One aspect of a contact structure that may affect contact resistance is contact area. Contact area can be a cross-sectional area of a junction between a contact and another material. For example, an area where a contact makes a connection to a semiconductor substrate can represent a contact area. In addition, an area where a via makes a connection to an underlying (and in some cases overlying) conductive pattern can represent a contact area. In some cases, a manufacturing process may have a minimum contact resistance value. Thus, it is desirable that a contact forming process be capable of meeting a minimum contact resistance value.

Typically, a contact structure may be formed by depositing an insulating layer over an underlying conducting layer. Conducting layers, as but one example, may include a conductor material, a semiconductor material, or some combination thereof. A hole may then be formed through the insulating layer to expose a portion of the underlying conducting layer. A contact material may then be formed in the contact hole that makes electrical contact with the underlying conducting layer. In this way, in many approaches, contact area may be determined by a contact hole formation step.

While a higher contact area is desirable, such a goal may conflict with the competing interest of making an integrated circuit as small as possible. For example, past manufacturing processes have included minimum spacing requirements between a contact hole and other structures. Such minimum spacing requirements can result in a larger device surface area. This can translate directly into a more costly semiconductor device. Thus, larger contact sizes have, in some conventional cases, come at the cost of increased device size.

One way to overcome such contact spacing constraints has been to use "self-aligned" contacts. A self-aligned contact may include an underlying structure that includes an insulating spacer (also referred to as a sidewall). A spacer can prevent a contact hole from exposing a corresponding underlying structure. This can enable a contact hole to overlap an adjacent structure—thus overcoming a minimum lateral spacing requirement.

A particular structure that may include a self-aligned contacts is an insulated gate field effect transistor (IGFET), such as a metal-oxide-semiconductor (MOS) FETs. Because transistors currently remain an elementary integrated circuit element, it is desirable to arrive at some way of making contacts to a transistor that can provide increased area, but not significantly increase the overall area of a transistor.

Many transistors can include one or more contacts to an active area. As one particular example, a transistor may include a source and drain regions formed in a substrate. In the case of an IGFET, a gate can be situated between a source and drain that includes spacers. Spacers on a gate may eliminate a minimum spacing requirement between a gate and source and drain regions.

To better understand the formation of certain integrated circuit structures, including contacts structures, a particular conventional self-aligned contact (SAC) approach is set forth in FIGS. 7A–7F. FIGS. 7A–7F set forth a number of side cross-sectional views of a portion of an integrated circuit.

FIG. 7A shows a substrate 700 on which may be formed one or more gate structures 702 of an insulated gate field effect transistor, such as a MOSFET. A substrate 700 many include doped monocrystalline silicon in which diffusion regions may be formed. A substrate 700 may also include isolation structures (not shown). A gate 702 can include a conductive portion 704 that may comprise doped polycrystalline (poly) silicon having a layer of silicide formed thereon. A gate 702 may further include a top insulating layer 706. A top insulating layer may comprise silicon nitride formed by chemical vapor deposition (CVD) techniques.

Referring to FIG. 7B, following the formation of gate structures 702, a spacer insulating layer 708 may be deposited. A spacer insulating layer 708 may comprise silicon nitride formed by CVD techniques.

Referring to FIG. 7C, an etch, such as an anisotropic etch, may remove portions of an insulating layer 708 and form spacers 710. Spacers 710 in combination with a top insulating layer 706 may allow for contacts that are self-aligned with respect to a gate structure 702.

FIG. 7D shows an integrated circuit following the formation of an interlayer dielectric 712. An interlayer dielectric 712 can insulate a substrate 700 and/or a conductive portion 704 from a subsequently formed interconnect pattern. An interlayer dielectric 712 may include borophosphosilicate glass (BPSG) and/or phosphosilicate glass (PSG) and/or undoped silicate glass (USG), to name but a few examples.

An interlayer dielectric 712 may also be planarized. A planarization step may include chemical-mechanical polishing (CMP), as but one example. Following the planarization of an interlayer dielectric 712 a self-aligned contact (SAC) etch mask may be formed. Such an etch mask may include an opening over a desired location for a contact hole. A "cap" layer of silicon dioxide 713 can be formed over an interlayer dielectric 712.

Once a SAC etch mask has been formed, a contact hole may be etched through an interlayer dielectric 712 and a cap layer 713 that exposes a portion of a substrate 700. A contact hole etch may include an anisotropic reactive ion etch (RIE), as but one example. A semiconductor device following the formation of a contact hole 714 is shown in FIG. 7E.

Referring now to FIG. 7F, a conductive material 716 may be formed in a contact hole 714 that may provide a conductive path to a substrate 700. As but one example, a metal such as tungsten may be deposited into a contact hole 714.

Following such a deposition, a planarization step, that may include CMP, can be performed. A semiconductor device following the deposition and planarization of a conductive material 716 is show in FIG. 7F.

FIG. 7F illustrates how spacers 710 may reduce available substrate area for a contact. In particular, FIG. 7F shows a number of measurements, including a contact material critical dimension (CD) measurement 718, shoulder loss measurements 720, and a contact area measurement 722. A contact material CD 718 may represent the smallest possible, or smallest desirable feature size for a conductive material 716 in a contact structure. Shoulder loss measurements 720 may represent a thickness of an insulating spacer that may encroach on a contact area. Contact area measurement 722 shows a resulting contact area taken by subtracting shoulder loss 720 from a contact material CD 718. Thus, increases in shoulder loss 720 can translate into decreased contact area, and hence higher contact resistance.

In addition to contact resistance and contact spacing requirements, another concern with integrated circuits can be the formation of doped regions in a substrate. For example, the formation of source and drain regions can affect the performance of a transistor. As transistor channel lengths have continued to shrink, the doping profiles of source and drain regions has increasingly impacted performance.

Source and drain regions are typically formed by forming oppositely doped regions in a semiconductor substrate. In most structures, a sharper doping profile can result in less leakage. Conversely, a more gradual doping profile may result in increased leakage. It is therefore desirable to form source and drain regions with sharper profiles if low leakage is a goal.

An increasing concern with small transistors, such as MOSFETs, has been "short channel" effects. Short channel can include hot-carrier effects that may result in unstable transistor operation and/or reduce transistor reliability. One way to reduce hot carrier effects is with lightly doped drain (LDD) regions. An LDD structure can typically include a lightly doped region between a source/drain and a corresponding channel.

One conventional approach to forming LDD regions may include an LDD ion implantation step prior to the formation of spacers. A "deep" or higher concentration ion implantation may then occur after the formation of spacers. This may produce an LDD region between a higher doped source/drain region and a corresponding transistor gate.

While conventional LDD regions may reduce short channel effects, such approaches may not provide sufficient distance between a more highly doped region and a transistor channel. Additional distance between a more highly doped source/drain region may be achieved with a spacer of increased thickness. However, as noted above, increasing spacer thickness can encroach on overall contact area. The converse can be true as well. Increased contact area may be achieved by reducing spacer thickness, but at the cost of increased transistor leakage.

It would be desirable to arrive at some way of providing reduced contact resistance without necessarily incurring the adverse effects of arising out of source/drain regions that formed too close to a transistor channel.

U.S. Pat. No. 5,763,312 issued to Jeng et al. and U.S. Pat. No. 5,899,722 issued to Huang teach arrangements in which a first spacer of silicon nitride is formed on gate conductor stacks. A silicon dioxide spacer is then formed on the silicon nitride spacer. A blanket dielectric layer can then formed over the gate structures. A self-aligned contact hole is etched through the blanket dielectric layer. The self-aligned contact hole etch removes the silicon dioxide spacer. A drawback to such an arrangement is that a single etch recipe may not be optimized for removal of both a blanket dielectric layer and a second spacer. Thus, underetch may occur, in which case residual second spacer can remain, or overetch may occur, in which case the substrate may be undesirably etched. If a second spacer is not removed a contact area can be smaller.

U.S. Pat. No. 5,846,857 issued to Ju discloses a process for optimizing N- and P-channel transistors that includes forming a first spacer of silicon dioxide on a transistor gate. A second spacer of silicon nitride is then formed on the first spacer spacer. The second spacer may then be removed. Ju does not appear to provide teachings on contact formation.

U.S. Pat. No. 5,851,866 issued to Son discloses NMOS and PMOS transistor gates having first spacers formed from phosphosilicate glass (PSG) and second spacers formed on the first spacers. The second spacers can be formed from silicon dioxide. Son does not appear to shown the removal of the second spacer.

U.S. Pat. No. 5,866,460 issued to Akram et al. shows a field effect transistor that includes a multiple implant lightly doped drain. Implants may be performed following the formation of a number of thin gate spacers. Alternatively, a thick spacer may be formed. Portions of the thick spacer may be removed with multiple etch steps, each accompanied by an implantation step. Akram et al. does not appear to disclose spacer spacers of different materials.

SUMMARY OF THE INVENTION

The various disclosed embodiments set forth methods of forming contacts. Particular embodiments disclose methods of forming self-aligned contacts to source and drain regions of a transistor having low leakage characteristics.

According to one embodiment, diffusion regions may be formed in a semiconductor device with a gate structure and first and second spacers as a mask. A second spacer may then be removed. An interlayer dielectric may then be formed over a gate structure and remaining first spacer. A contact hole may then be etched through an interlayer dielectric that can be self-aligned with respect to a gate structure. Such an approach may form transistors having source/drain regions spaced from a channel by a thickness of two spacers and a contact hole separated from a gate structure by a single spacer. Further, removing a second spacer prior to a self-aligned contact etch may allow for a contact etch to be tailored to an interlayer dielectric material. Removal of a second spacer can increase contact area.

According to one aspect of the embodiments, a first spacer may comprise silicon nitride while a second spacer may comprise silicon dioxide.

According to another aspect of the embodiments, a second spacer may be removed with a substantially isotropic etch. An isotropic etch can be a wet chemical etch.

According to another aspect of the embodiments, an interlayer dielectric may comprise high density plasma (HDP) phosphosilicate glass (PSG). A contact etch may be highly selective between HDP PSG and a silicon nitride first spacer.

According to another aspect of the embodiments, other diffusion regions may be formed in a semiconductor device with a gate structure as a mask prior to the formation of first and second spacers.

According to another aspect of the embodiments, a contact may be formed in an etched contact hole that includes a liner layer. A liner layer may form a contact diffusion barrier at a substrate and/or provide adhesion of a subsequent contact material to a liner.

DETAILED DESCRIPTION OF THE EMBODIMENTS

Various embodiments of the present invention will now be described in conjunction with a number of diagrams. The embodiments set forth approaches to forming contacts, including self-aligned contacts, to transistor diffusion regions in an integrated circuit. A structure according to the present invention may allow for larger contact area while retaining low transistor leakage characteristics.

Figure 1:
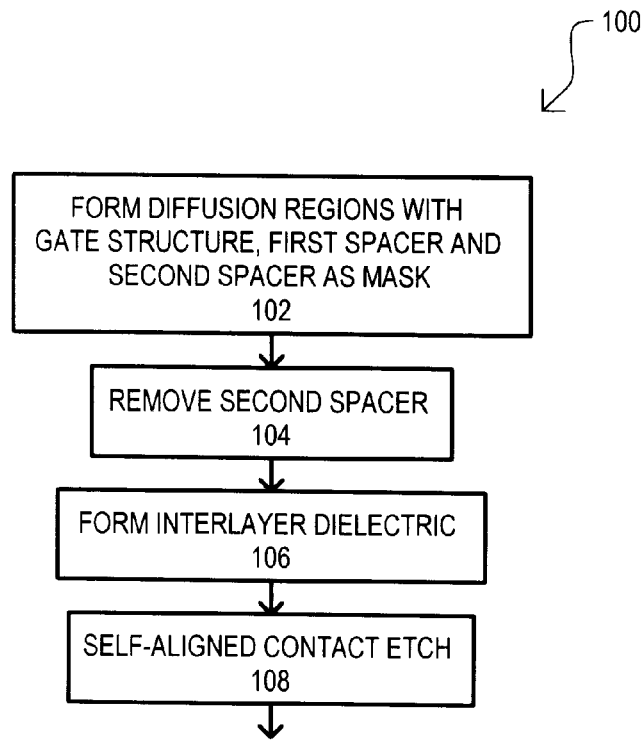
FIG. 1 is a flow diagram of a first embodiment.

Referring now to FIG. 1, a flow diagram is set forth illustrating a method of forming a semiconductor device according to a first embodiment. The first embodiment is designated by the general reference character 100, and may include forming a diffusion region with a particular mask structure (step 102). A particular mask structure may include a gate structure, a first spacer and a second spacer.

Figure 2A:
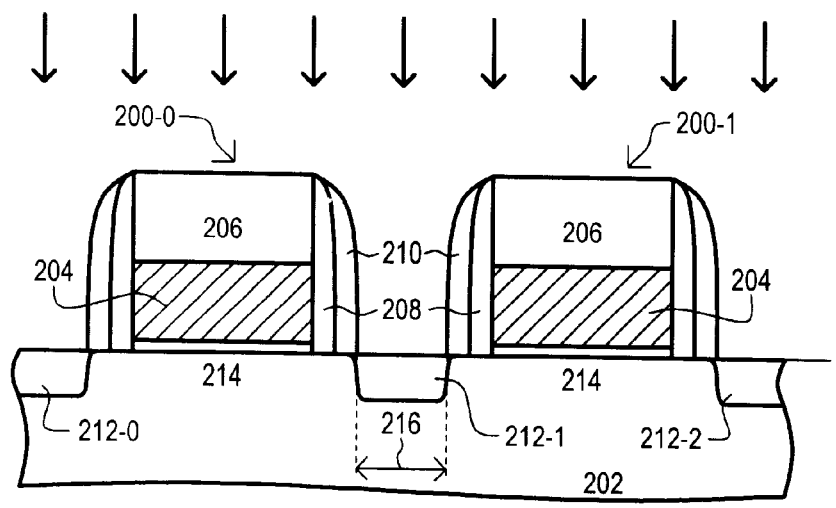
FIGS. 2A to 2D are side cross sectional views showing the method of FIG. 1.

FIG. 2A is a diagrammatic representation of a step 102. Gate structures 200-0 and 200-1 may be formed on a substrate 202. Each gate structure (200-0 and 200-1) may include a conducting gate 204 and a top insulating layer 206. A conducting gate 204 may comprise polycrystalline (poly) silicon, more particularly doped polysilicon with a refractory metal silicide formed thereon. A first spacer 208 may be formed on sides of a conducting gate 204 and second spacers 210 may be formed on first spacers 208.

Second spacers 210 may be formed from a material that may etch at a different rate than first spacers 208 and/or top insulating layer 206. As but one example, second spacers 210 may be formed from silicon dioxide while first spacers 208 and top insulating layer 206 may be formed from silicon oxynitride, or more preferably silicon nitride.

Diffusion regions 212-0 to 212-2 may be formed by exposing a substrate 202 to a dopant source using gate structures (200-0 and 200-1) and corresponding first and second spacers (208 and 210) as a mask. Consequently, portions of a substrate 202 not covered by a gate structure (200-0 and 200-1) or first or second spacers (208 or 210) may receive dopants, thereby forming diffusion regions (212-0 to 212-2). Portions masked by gate structures (200-0 and 200-1) may include channel regions (214).

In one particular arrangement, a dopant source may be an ion implantation source. Ion implanted dopants are diagrammatically represented in FIG. 2A by arrows. It is noted that a diffusion step such as that shown in FIG. 2A may preferably include a single ion implantation step for forming diffusion region of arsenic (As) doped silicon, alternate approaches may include more than one ion implantation step. For example, in the event double diffused drain (DDD) regions are formed, a second implantation step may introduce a dopant having a different mobility. In particular, two implant steps may form a double diffused region of phosphorous P and As.

Referring back to FIG. 2A, it is shown that diffusion regions (212-0 to 212-2) may be separated from channel regions 214 by a lateral distance determined essentially by a bottom thickness of a first spacer and second spacer (208 and 210). Such a distance is greater than that of a single spacer arrangement, and can allow for a transistor with lower leakage characteristics. However, a first and second spacer (208 and 210) may also result in a reduced available contact area, as shown by measurement bar 216.

Figure 2B:
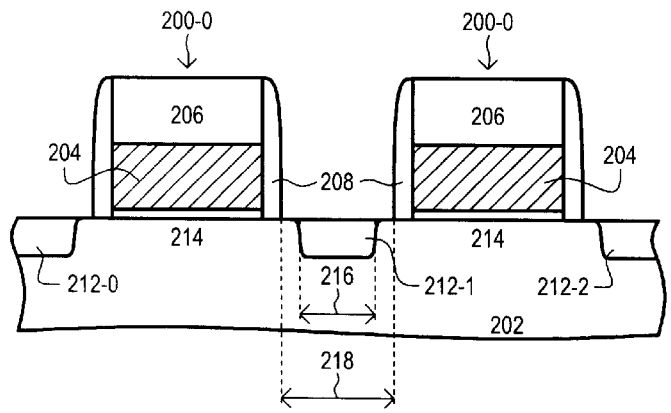
Figure 2C:
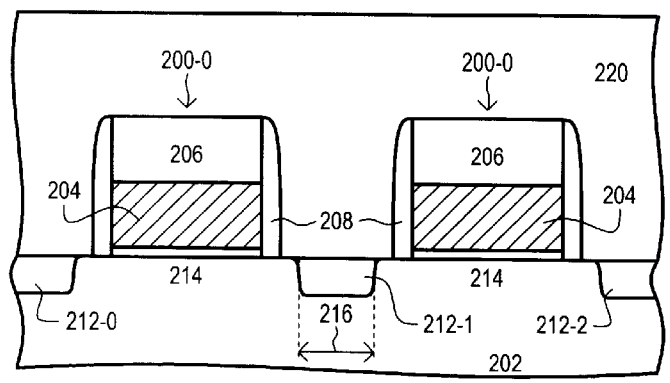
Figure 2D:
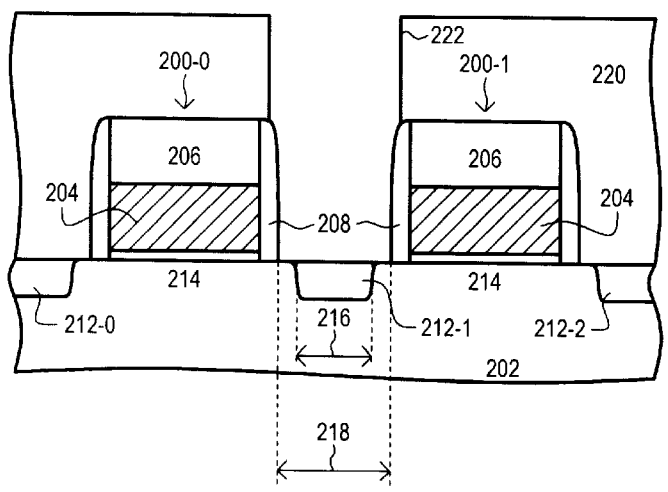

It is further noted that while diffusion region (212-0 to 212-2) are shown having particular boundaries in FIGS. 2B to 2D, such a particular arrangement should not be construed as limiting to the invention. Temperature cycles in a manufacturing process may result in out-diffusion of dopants. Consequently, a resulting diffusion region (212-0 to 212-2) profile may have wider/narrower and/or deeper/shallower extents.

Referring back to FIG. 1, following a formation of diffusion regions, a second spacer may be removed (step 104). A step 104 may preferably remove a second spacer while keeping a first spacer essentially intact. In one particular arrangement, a second spacer may be removed with an essentially isotropic etch. As but one example, a wet chemical silicon dioxide etch can be used to remove a second spacer formed from silicon dioxide. Preferably, second spacers may comprise undoped silicon dioxide, and a wet etch including a buffered solution of hydrofluoric acid (HF) can remove such second spacers. It is noted that a substantially isotropic etch may be more efficient at removing lower portions of a second spacer than other etches with a higher degree of anisotropy.

One example of a semiconductor device following a step 104 is shown in FIG. 2B. Following the removal of a second spacer 210 an available contact area may be larger, as shown by measurement bar 218, which is larger than measurement bar 216.

Following the removal of a second spacer, an interlayer dielectric may be formed over remaining gate structures and first spacers (step 106). An interlayer dielectric may provide insulation between a substrate and/or gate structures and a subsequently formed conducting layer.

FIG. 2C shows a semiconductor device following a step 106. An interlayer dielectric 220 can be formed over a substrate 200, gate structures (200-0 and 200-1), and first spacers 208. An interlayer dielectric 200 may be preferably formed from a material that may be etched at a different rate than first spacers 208. As but one example, an interlayer dielectric 220 may comprise silicon dioxide in the event first spacers 208 comprise silicon nitride and/or silicon oxynitride. Preferably, an interlayer dielectric 220 may comprise silicon dioxide doped with phosphorous and/or boron. More preferably, an interlayer dielectric 220 may comprise phosphosilicate glass (PSG) deposited with a high density plasma.

Referring once again to FIG. 1, a method 100 may include a self-aligned contact etch (step 108). A self-aligned contact may include forming a contact hole that does not include a minimum spacing requirement from an adjacent conducting structure, such as a transistor gate. A self-aligned contact etch step 108 can expose an insulating spacer and/or a top insulating layer of a gate structure.

FIG. 2D shows one example of a semiconductor device following a step 108. A self-aligned contact hole 222 has been formed through an interlayer dielectric 220. In the particular example of FIG. 2D, first spacers 208 have provided lateral insulation between contact hole 222 and conductive gate 204.

Because an interlayer dielectric 220 may have a different etch rate than first spacer 208, a contact hole 222 may expose a portion of a substrate while keeping first spacers 208 essentially in tact. As a result, a contact formed in contact hole 222 may have a contact area, represented in FIG. 2D by measurement bar 218 that is larger than that of a contact having two spacers. At the same time, a low leakage transistor structure can be formed by spacing diffusion regions 212-0 to 212-2 further from a channel region than a single spacer structure.

It is further noted that a self-aligned contact etch step 108, unlike other conventional double spacer arrangements that retain a second spacer, can be tailored to removing interlayer dielectric 220. Other conventional double spacer arrangements may include two etch steps, one for an interlayer dielectric and one for a second spacer. This can add complexity and time to a manufacturing process. Alternatively, a conventional double spacer arrangement may use one etch for a both an interlayer dielectric and a second spacer. Such an etch may not be optimize for both, and consequently may be harder to control. In particular, it is noted that a second spacer may be undoped silicon dioxide while an interlayer dielectric may be a doped silicon dioxide. A doped silicon dioxide may etch at a faster rate. Further, while a second spacer and interlayer dielectric may be both formed from silicon dioxide, a spacer of silicon dioxide is often denser than an interlayer silicon dioxide, and so may etch a different rate. By removing a second spacer 210 prior to forming a contact hole 222, a method according to the present invention may provide more controllability in the formation of a contact hole than other conventional approaches.

In one particular arrangement, a contact hole 222 may be formed with an anisotropic etch that is highly selective between a first spacer 208 material and an interlayer dielectric material 220. More preferably, a first spacer 208 may comprise silicon nitride and interlayer dielectric 220 may comprise HDP PSG, and a contact hole 222 may be formed with a reactive ion etch having a high degree of selectivity between silicon nitride and PSG.

Figure 3:
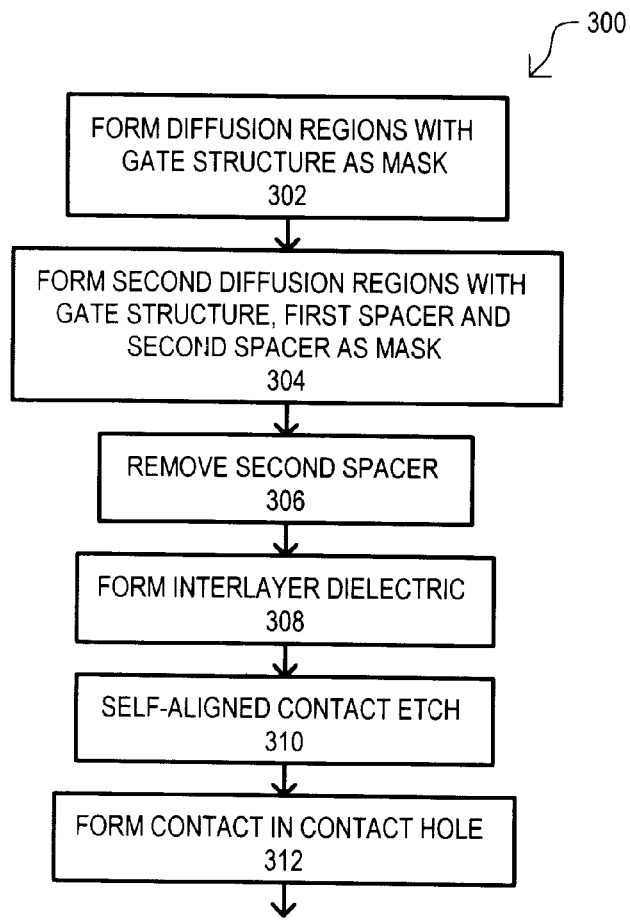
FIG. 3 is a flow diagram of a second embodiment.

FIG. 3 shows a method of forming a semiconductor device according to a second embodiment. The method may include forming more than one type diffusion region by utilizing different structures as masks.

The second embodiment is designated by the general reference character 300 and may include forming a diffusion region with a gate structure as a mask (step 302). A step 302 may form diffusion regions that are closer to a channel region than conventional source and drain diffusions formed after the creation of spacers on a gate. A step 302 may form diffusion regions that have a lower concentration of dopants and/or a shallower diffusion depth than subsequently source/drain regions. Such diffusion regions may be lightly doped drain (LDD) regions, as but one example.

Figure 4A:
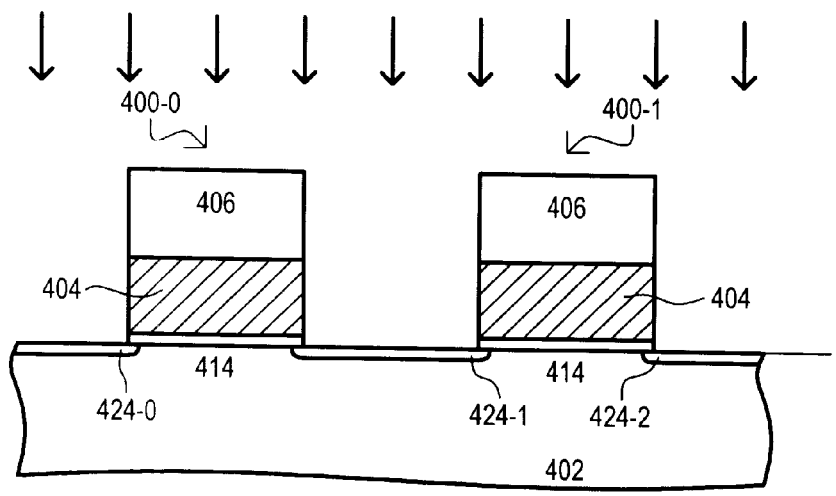
FIGS. 4A to 4F are side cross sectional views showing the method of FIG. 3.

A step 302 is shown in FIG. 4A. Gate structures 400-0 and 400-1 are formed over a substrate 400. Each gate structure (400-0 and 400-1) may include a conductive gate 404 and a top insulating layer 406. Gate structures (400-0 and 400-1) can function as masks in forming first diffusion regions 424-0 to 424-2. First diffusion regions (424-0 to 424-2) may be formed adjacent to channel regions 414.

FIG. 4A shows a particular diffusion region forming step that includes ion implantation, diagrammatically represented by downward pointing arrows. In the particular example of FIG. 4A, such an ion implantation step can be performed at a lower concentration and/or lower energy than subsequent ion implantation steps that form source and/or drain regions. As a result, first diffusion regions (424-0 to 424-2) can be shallower and have a lighter doping concentration than subsequently formed source/drain regions. More particularly, first diffusion regions (424-0 to 424-2) can be LDD regions.

A second embodiment 300 may further include forming source and drain diffusion regions with a gate structure, first spacer and second spacer functioning as a mask (step 304). Such a step can form second diffusion regions that may be situated within first diffusion regions. More particularly, source and drain regions may be formed with surrounding LDD regions.

Figure 4B:
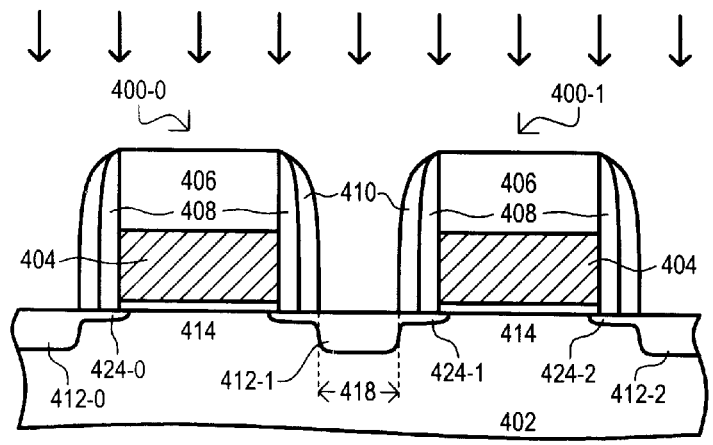

FIG. 4B shows a side cross sectional view of a semiconductor device formed according to step 304. In the arrangement of FIG. 4B first spacers 408 have been formed on the sides of gate structures 400-0 and 400-1. Further, second spacers 410 have been formed on first spacers 408. First and second spacers (408 and 410) may comprise the various materials described in conjunction with FIG. 2A.

Dopants can be introduced into portions of a substrate 400 not covered by a gate structure (400-0 and 400-1), first spacer 408 or second spacer 410. This can result in the formation of second diffusion regions 412-0 to 412-2.

In the particular arrangement of FIG. 4B, ion implantation may be used to form second diffusion regions (412-0 to 412-2). Such an implant is diagrammatically represented by vertical arrows, and can be performed at a higher concentration and/or higher energy than a previous ion implantation step, such as that shown in FIG. 4A. As a result, second diffusion regions (412-0 to 412-2) can be deeper and/or have a higher doping concentration than previously formed diffusion regions, such as LDD regions. More particularly, second diffusion regions (412-0 to 412-2) can be deeper diffused and higher doped source/drain regions with shallower and lighter doped LDD regions (424-0 to 424-2).

As in the case of FIGS. 2B to 2D, it is noted that while first and second diffusion regions (412-0 to 412-2 and 424-0 to 424-2) are shown having particular boundaries in FIGS. 4B to 4F, such a particular arrangement should not be construed as limiting to the invention. Temperature cycles in a manufacturing process may result in out-diffusion of dopants. Consequently, a resulting diffusion region (412-0 to 412-2 and 424-0 to 424-2) may have a variety of profiles.

Figure 4C:
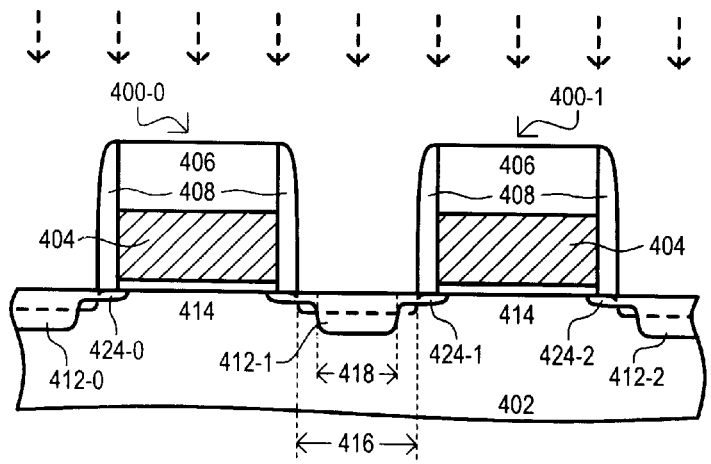

Referring back to FIG. 3, a second embodiment may further include removing second spacers (step 306). A second spacer removal step may occur in the same general fashion as described in conjunction with FIGS. 2B. A semiconductor device following a step 306 is shown in FIG. 4C.

It is further noted that while a preferred embodiment may not form additional diffusion following the removal of second spacers, such a step could be included if a different doping profile was desired. For example, another ion implantation step could be included. Such a possible ion implantation step is diagrammatically represented in FIG. 4C by dashed arrows and dashed diffusion regions.

Figure 4D:
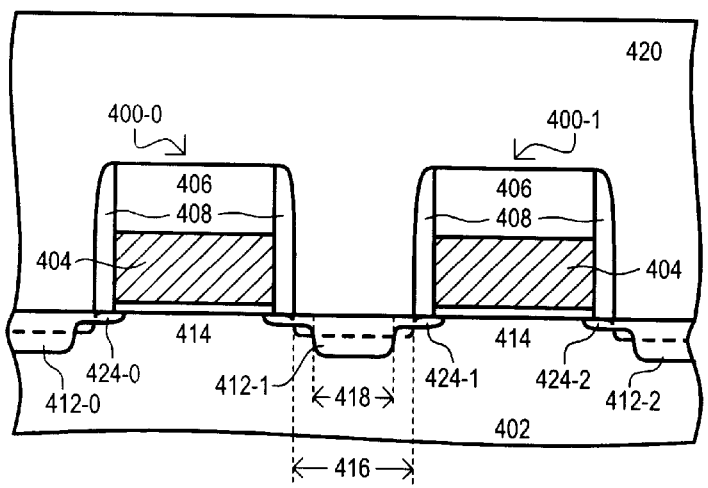

A second embodiment 300 may further include forming an interlayer dielectric (step 308). A step 308 may occur in the same general fashion as described in conjunction with FIG. 2C. A semiconductor device following a step 308 is shown in FIG. 4D.

Figure 4E:
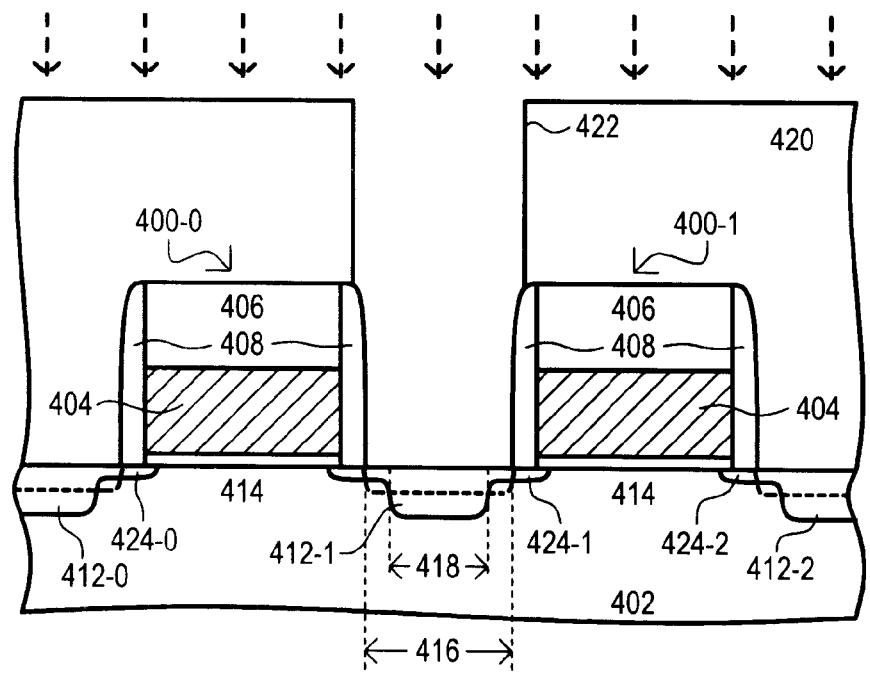

Following the formation of an interlayer dielectric, a second embodiment 300 may continue with a self-aligned contact etch (step 310). A step 310 may occur in the same general fashion as described in conjunction with FIGS. 2D. A semiconductor device following a step 310 is shown in FIG. 4E.

It is noted that while a preferred approach may not include forming additional diffusion regions after a contact etch step, such an additional step could be included. For example, another ion implantation step could take place if a different profile doping was desired. Such a possible ion implantation step is diagrammatically represented in FIG. 4E by dashed arrows and dashed diffusion regions.

A second embodiment 300 may also include forming a contact within a contact hole (step 312). Such a step may include depositing, sputtering and/or otherwise forming one or more conductive materials within a contact hole that make contact with a substrate 402. A semiconductor device following a step 312 is shown in FIG. 4F.

Figure 4F:
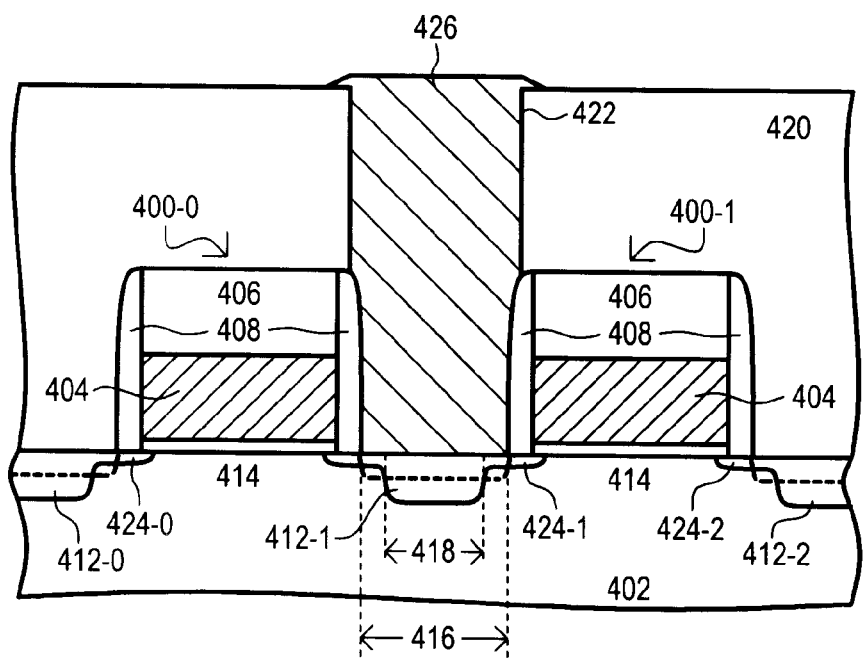

In FIG. 4F, a contact 426 is formed in contact hole 422. A contact 426 may comprise a conductive material, including but not limited to, doped polycrystalline silicon (polysilicon), a silicon-metal alloy (silicide), preferably with a refractory metal. A contact may also comprise one or more metal layers and/or alloys. As just a few examples, a contact can include aluminum, copper, or more complex arrangements, such as a titanium(Ti)-tungsten(W) alloy layered onto bulk aluminum, with an underlying barrier layer comprising Ti, Ti-nitride (TiN), or a Ti alloy.

Still further, to improve conductivity and reduce undesirable out-diffusion of a contact metal ("spiking"), a contact may include a silicide layer at a contact-substrate junction. Such a junction may include, without limitation, titanium silicide, tungsten silicide, platinum silicide, tantalum silicide and/or molybdenum silicide, to name but a few examples.

A second embodiment 300 may thus teach an approach to forming contacts that may provide various diffusion regions including first diffusion regions (412-0 to 412-2) and second diffusion regions (424-0 to 424-2). First diffusion regions (412-0 to 412-2) can be formed closer to channel regions 414 than second diffusion regions (424-0 to 424-2). Further, second diffusion regions (424-0 to 424-2) may be formed at a distance from channel regions 414 that is greater than a lateral width of one spacer.

Figure 5A:
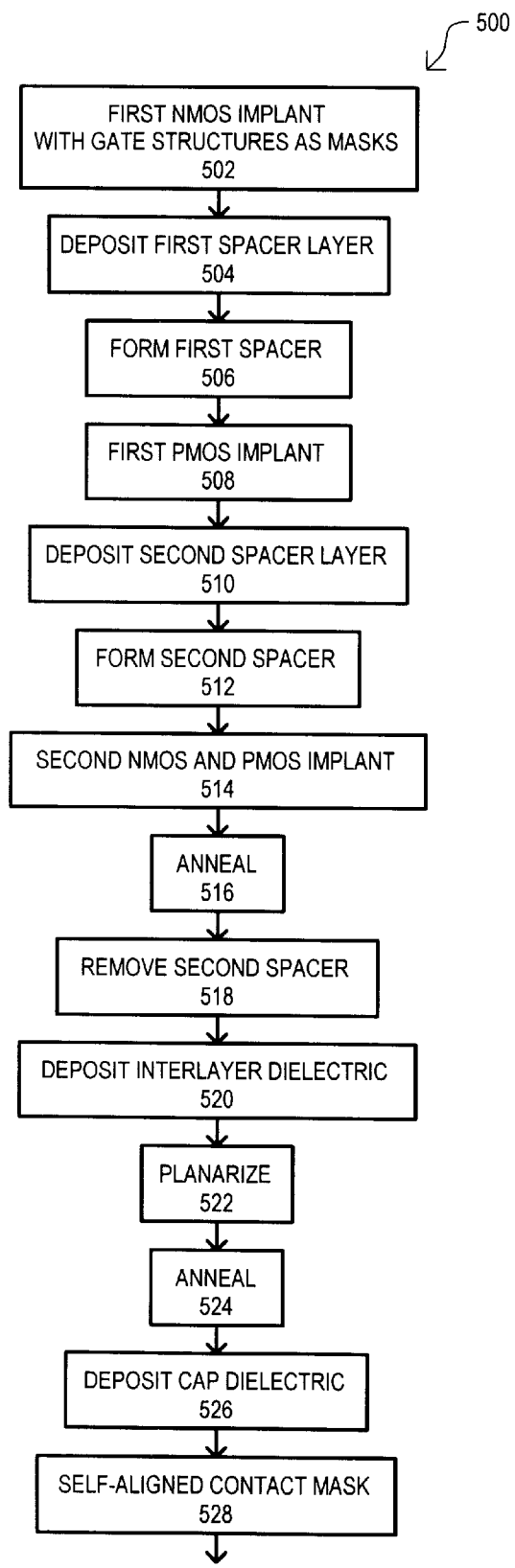
FIGS. 5A and 5B are flow diagrams of a third embodiment.
Figure 5B:
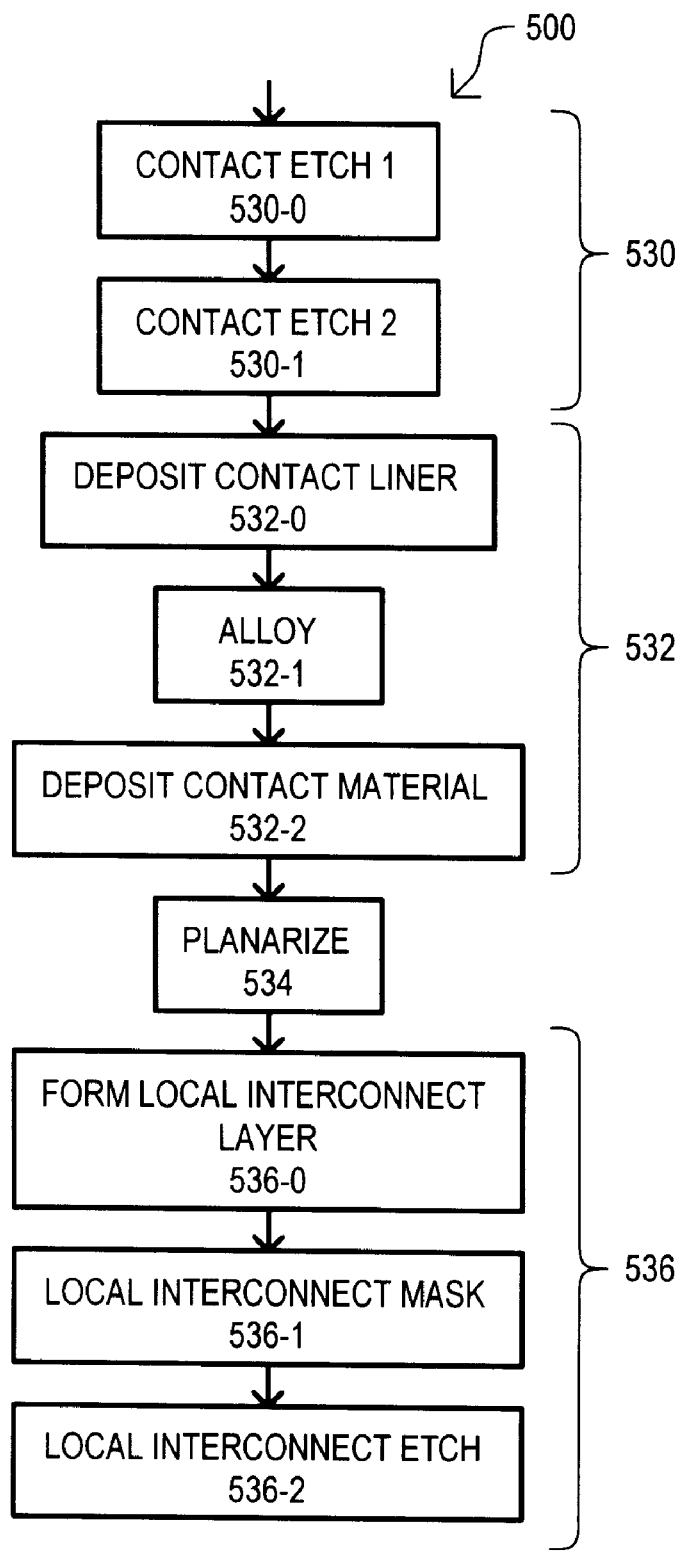

Referring now to FIGS. 5A and 5B, a method of forming a semiconductor device according to a third embodiment is shown in a flow diagram. The method may include forming self-aligned contacts to complementary insulated gate field effect transistors that can have favorable low leakage characteristics. The various steps of FIGS. 5A and 5B are further illustrated in a series of side cross sectional views in FIGS. 6A to 6T.

A third embodiment is designated by the general reference character 500, and may include a first implant step for a transistor of a first conductivity type that includes gate structures as a mask (step 502). In FIG. 5A, the particular transistor is an n-channel metal-oxide-semiconductor (NMOS) transistor. A step 502 may form first diffusion regions in a substrate that may reduce adverse effects, including short channel effects. A semiconductor device following a step 502 is shown in FIG. 6A.

Figure 6A:
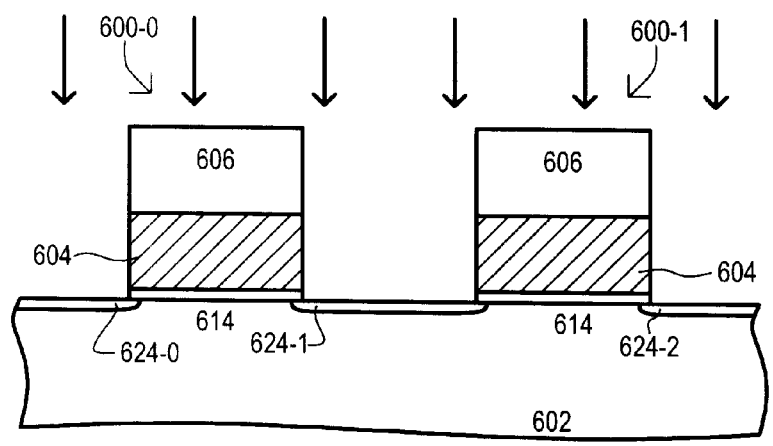
FIGS. 6A to 6T are side cross sectional views showing the method of FIG. 5.

FIG. 6A includes gate structures 600-0 and 600-1 formed on a substrate 602. Gate structures (600-0 and 600-1) may include a conductive gate 604 and a top insulating layer 606. A conductive gate 604 may comprise one or more conducting layers. More particularly, a conductive gate 604 may include a lower layer of doped polycrystalline and/or a silicide layer. A top insulating layer 606 may comprise a material that can be etched at a different rate than a subsequently deposited interlayer dielectric. In one particular arrangement, a top insulating layer 606 may comprise silicon nitride formed with chemical vapor deposition (CVD) techniques.

Gate structures (600-0 and 600-1) may be formed by depositing a conducting gate layer and then a top insulating layer over a substrate 602. More particularly, such layers may be deposited over a substrate 602 having active regions covered with a gate insulator and separated laterally from one another by isolation structures (not shown). A gate etch mask may be formed, and the layers may be etched to form gate structures (600-0 and 600-1). Such an etch may be a substantially anisotropic etch, such as a reactive ion etch or the like.

FIG. 6A also diagrammatically represents an ion implantation of dopants as vertically pointing arrows. An ion implantation step such as that shown in FIG. 6A may form first diffusion regions (624-0 to 624-1) in a substrate 602. In one very particular arrangement, a step 502 may include an ion implantation of arsenic (As) at a concentration in the general range of $50 \times 10^{11}/cm^2$ to $50 \times 10^{13}/cm^2$, more particularly about $55 \times 10^{12}/cm^2$. Ion implantation energy may be in the general range of 40 to 100 keV, more particularly about 70 keV. A beam current for particular ion implantation machines can be 75 uA.

A third embodiment 500 may continue with the deposition of a first spacer layer (step 504). A first spacer layer may be formed over and particularly along the sides of gate structures. A semiconductor device following a step 504 is shown in FIG. 6B.

Figure 6B:
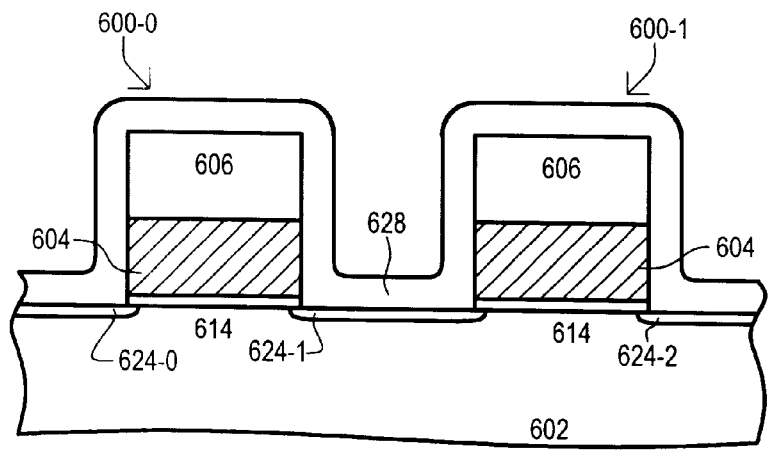

FIG. 6B shows a first spacer layer 628 formed over gate structures 600-0 and 600-1. A first spacer layer 628 may comprise a material that can be etched at a different rate than a subsequently deposited interlayer dielectric. In one particular arrangement, a first spacer layer 628 may comprise silicon nitride formed with chemical vapor deposition (CVD) techniques.

More particularly, a first spacer layer 628 may be formed by low pressure CVD techniques. Such a deposition process may be performed at a temperature in the general range of 600 to 800° C., more particularly about 750° C., and at a pressure in the general range of 50 mTorr to 200 mTorr, more particularly about 100 mTorr. Source materials may comprise dichlorosilane ($SiHCl_2$) and ammonia ($NH_3$). Flow rates between $SiHCl_2$ and $NH_3$ may be at a ratio in the range of 1:2 to 1:4, more particularly at a ratio of 1:3, with $SiHCl_2$ flowing at a rate of 30 standard centimeters cubed per minute (sccm) and $NH_3$ flowing at a rate of 90 sccm. A first spacer layer 628 may be deposited to a thickness in the range of 250 Å to 750 Å, more particularly 400 Å to 600 Å, even more particularly about 500 Å.

Following the deposition of a first spacer layer, a third embodiment 500 may continue by forming first spacers (step 506). Forming a first spacer may include substantially anisotropically etching a first spacer layer to produce first spacers on gate structures. A semiconductor device following a step 506 is shown in FIG. 6C.

Figure 6C:
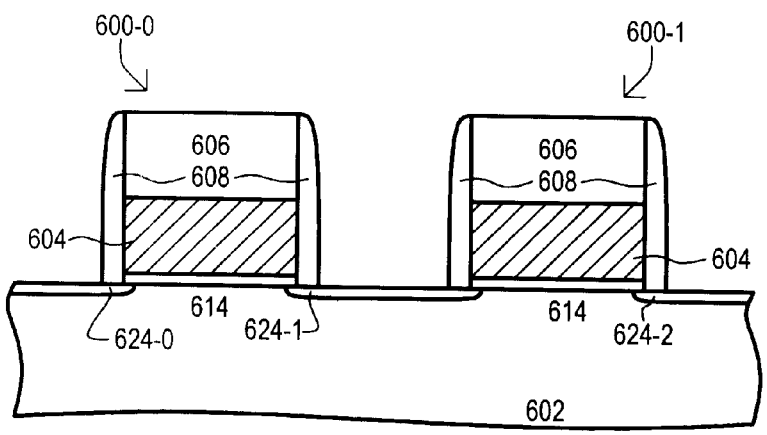

FIG. 6C shows first spacers 608 formed on gate structures (600-0 and 600-1). First spacers 608 may provide lateral insulation for conducting gates 604 while top insulating layer 606 may provide vertical insulation for conducting gates 604.

In one particular arrangement, a first spacer forming etch may be a reactive ion etch (RIE) at a RF power in the general range of 200 to 500 W, more particularly about 350 W, and a pressure in the general range of 20 to 70 mTorr, more particularly about 50 mTorr. Etch gases may include a one or more reactive gas and one or more inert gases. In one particular arrangement a reactive gas may include one or more chlori- and/or fluorinated carbon molecules. Such gases may include $CFCl_3$, $CF_2Cl_2$, $CF_3Cl$, $CF_4$, $CHF_3$, $C_2ClF_5$, and/or $C_2H_2F_4$, as just a few examples.

In one particular arrangement, a first spacer etch may include $CHF_3$ and argon (Ar). Flow rates between $CHF_3$ and Ar be at a ratio in the range of 1:5 to 1:10, more particularly at a ratio of 1:7.5, with $CHF_3$ flowing at a rate of 10 sccm and Ar flowing at a rate of 75 sccm. For equipment that may cool wafers on chucks, such cooling may be accomplished by helium (He) at a pressure of 8 Torr.

Figure 6D:
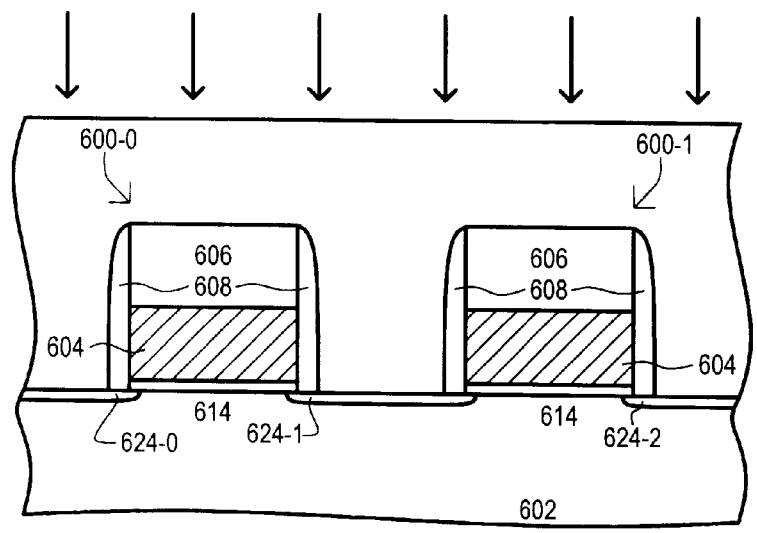

Following the deposition of a first spacer layer, a third embodiment 500 may continue with a first implant step for a transistor of a second conductivity type (step 508). In FIG. 5, the particular transistor is a p-channel metal-oxide-semiconductor (PMOS) transistor. During a step 508, transistors of a first conductivity type may be masked from such an implant. In one particular arrangement such a step may include the ion implantation of boron B. A semiconductor device following a step 508 is shown in FIG. 6D.

A third embodiment 500 may continue with the deposition of a second spacer layer (step 510). A second spacer layer may be formed over, and particularly along the sides of first spacers. A semiconductor device following a step 510 is shown in FIG. 6E.

Figure 6E:
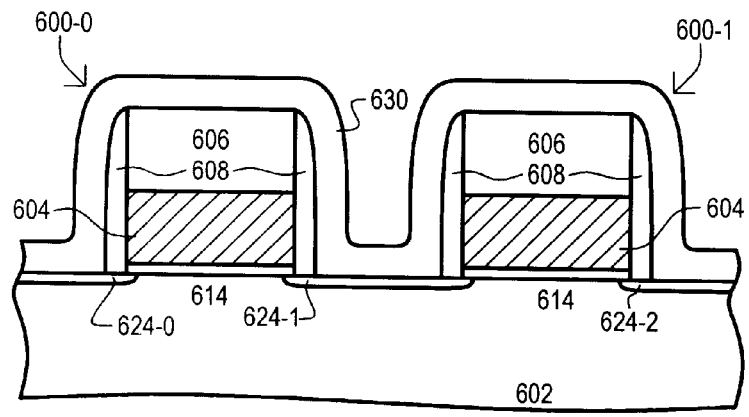

FIG. 6E shows a second spacer layer 630 formed over gate structures 600-0 and 600-1 and first spacers 608. A second spacer layer 630 may comprise a material that can be etched at a different rate than a first spacer 608. In one particular arrangement, a second spacer layer 630 may comprise silicon dioxide formed with CVD techniques. More particularly, a second spacer layer 630 may be formed by LPCVD techniques.

Such a deposition process may be performed at a temperature in the general range of 850 to 1500° C., more particularly about 950° C., and a pressure in the general range of 200 to 500 mTorr, more particularly about 300 mTorr. Source materials may comprise $SiHCl_2$ and nitrous oxide ($N_2O$). Flow rates between $SiHCl_2$ and $N_2O$ may be at a ratio in the range of 1:2 to 1:4, more particularly at a ratio of about 3.5:10, with $SiHCl_2$ flowing at a rate of 14 sccm and $N_2O$ flowing at a rate of 40 sccm. A second spacer layer 630 may be deposited to a thickness in the range of 250 Å to 750 Å, more particularly 400 Å to 600 Å, even more particularly about 500 Å.

Following the deposition of a second spacer layer, a third embodiment 500 may continue by forming second spacers (step 512). Forming a second spacer may include substantially anisotropically etching a second spacer layer to produce second spacers on first spacers. A semiconductor device following a step 512 is shown in FIG. 6F.

Figure 6F:
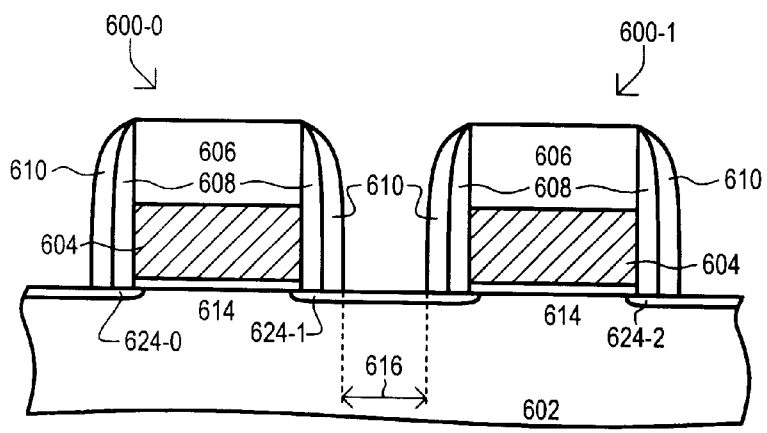

FIG. 6F shows second spacers 610 formed on first spacers 608. In one particular arrangement, a second spacer forming etch may be a reactive ion etch (RIE) at an RF power in the general range of 400–700 W, more particularly about 540 W, and a pressure in the general range 100 to 300 mTorr, more particularly about 200 mTorr. Etch gases may include one or more reactive gases and one or more inert gases. As in the case of a first spacer etch, reactive gases may include one or more chlori- and/or fluorinated carbon molecules. Such gases may include $CFCl_3$, $CF_2Cl_2$, $CF_3Cl$, $CF_4$, $CHF_3$, $C_2ClF_5$, $C_2F_6$ and/or $C_2H_2F_4$, as just a few examples. In one particular arrangement, a second spacer etch may include $CF_4$ and $CHF_3$ and Ar. Flow rates between $CF_4$ and $CHF_3$ may be at a ratio in the range of 1:2 to 1:3, more particularly at a ratio of 1:3, with $CF_4$ flowing at a rate of 15 sccm and $CHF_3$ flowing at a rate of 45 sccm. Flow rates between an active gas (or active gases) and Ar may be at a ratio in the range of 2:1 to 1:2, more particularly about 1:1, with $CF_4$ and $CHF_3$ flowing at a total rate of 60 sccm and Ar flowing at a rate of 65 sccm. For equipment that may cool wafers on chucks, such cooling may be accomplished by He at a pressure of 14 Torr.

Referring again to FIG. 5, a third embodiment may continue with second implant steps for transistors of first and second conductivity types (step 514). In a step 514 a gate structure, first spacer and second spacer may function as a mask to form second diffusion regions of transistors. A semiconductor device following a step 514 is shown in FIG. 6G.

Figure 6G:
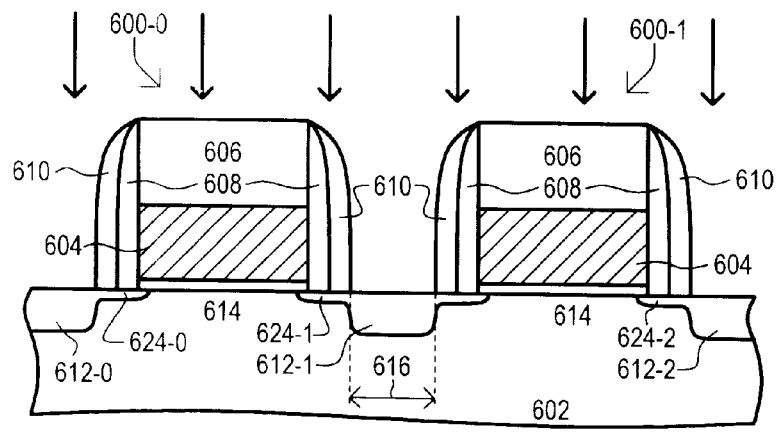

FIG. 6G diagrammatically represents an ion implantation of dopants as vertically pointing arrows. An ion implantation step such as that shown in FIG. 6A may form second diffusion regions 612-0 to 612-2 in a substrate 602. In one very particular arrangement, a step 514 may include the ion implantation of phosphorous (P) at a concentration in the general range of $50\times10^{13}/cm^2$ to $1.0\times10^{15}/cm^2$, more particularly about $1.4\times10^{14}/cm^2$, and at an energy of in the general range of 30–70 keV, more particularly about 50 keV to form NMOS transistor sources and drains. In this way second diffusion regions 612-0 to 612-2 may be formed in a substrate 602. It is noted that a step 514 may continue by forming source and drain regions in transistors of a second conductivity type. More particularly, NMOS transistor may be masked while B is implanted to form PMOS sources and drains.

FIG. 6G includes further includes a measurement bar 616 that shows available contact area following a formation of first and second spacers (608 and 610). A third embodiment 500 can provide for small spacing relative to other conventional approaches. A measurement bar 616 may be less than 0.18 microns (μm), more particularly less than 0.15 μm, even more particularly about 0.12 μm.

Following an implantation of dopants to form second diffusion region, a semiconductor device may be subject to a heat treatment such as an anneal (step 516). An anneal may repair lattice damage produced by previous ion implantation steps and/or result in some out-diffusion of dopants. In one a particular embodiment, an anneal step may be a rapid thermal anneal (RTA) at a temperature in the general range of 800 to 1000° C., more particularly about 950° C.

Following an anneal step 516, second spacers may be removed (step 518). A semiconductor device following a step 516 is shown in FIG. 6H.

Figure 6H:
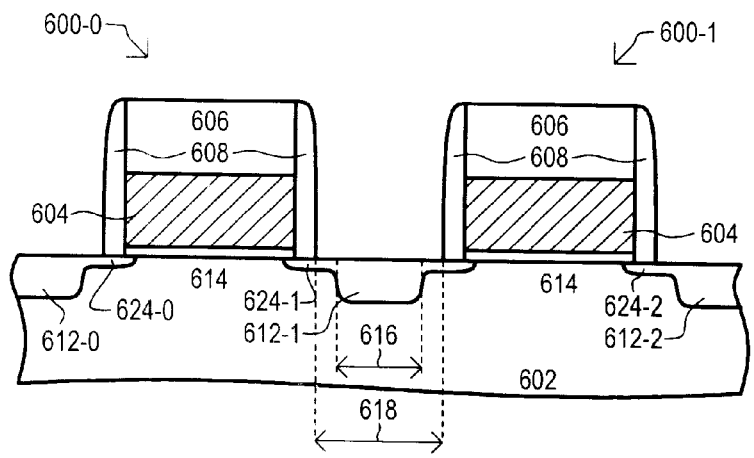

FIG. 6H includes a measurement bar 618 that shows how removing a second spacer 610 may result in increased contact area over the case where two spacers exists (measurement bar 616 of FIG. 6G). A second spacer etch may include a substantially isotropic wet chemical etch. More particularly, a second spacer of LPCVD silicon dioxide may be removed with a buffered solution of hydrofluoric acid (HF). As noted above, an isotropic wet chemical etch may have advantages over other types of etches, such as RIE methods.

A measurement bar 618 in FIG. 6H can show available contact area following a removal of second spacers 610. A third embodiment 500 can provide for small spacing relative to other conventional approaches. A measurement bar 618 may be greater than 0.09 microns (μm), more particularly greater than 0.15 μm, even more particularly about 0.17 μm.

A third embodiment 500 may further include forming an interlayer dielectric (step 520). A semiconductor device following a step 520 is shown in FIG. 6I.

Figure 6I:
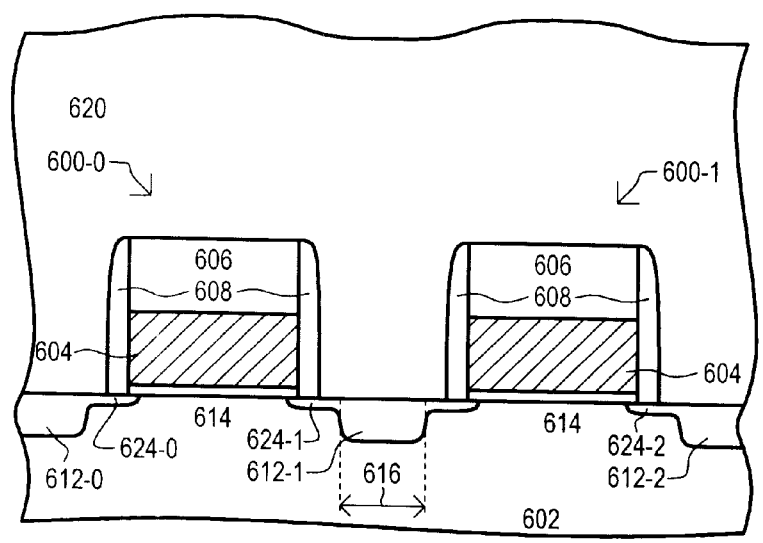

FIG. 6I shows an interlayer dielectric 620 formed over gate structures (600-0 and 600-1) and first spacers 608. An interlayer dielectric 620 may comprise silicon dioxide, more particularly doped silicon dioxide. In one particular arrangement, an interlayer dielectric 620 may be phosphosilicate glass (PSG) deposited using a high density plasma (HDP).

An HDP PSG deposition process may include source RF power in a general range of 3000–5000 W, more particularly about 4000 W. Bias RF power can be in the general range of 1200–1800 W, more particularly about 1500 W. HDP PSG may be formed with silane ($SiH_4$), oxygen ($O_2$), and phosphine ($PH_3$) as source materials. In one very particular approach, $SiH_4$ flows can be in the general range of 20–30 sccm, more particularly about 26 sccm, $O_2$ flows can be in the general range of 300–500 sccm, more particularly about 400 sccm, and phosphine flows can be in the general range of 150–250 sccm, more particularly about 200 sccm. An inert gas, such as argon may also flow in the reaction chamber at a rate in the general range of 25–45 sccm, more particularly about 35 sccm.

In one embodiment, a PSG interlayer dielectric may be deposited at a thickness in the general range of 7000 to 11,000 Å, more particularly, about 9,000 Å.

Following the deposition of an interlayer dielectric, an interlayer dielectric may be planarized (step 522). A planarization step may form an essentially uniform flatness on a top surface of an interlayer dielectric. A semiconductor device following a step 522 is shown in FIG. 6J.

Figure 6J:
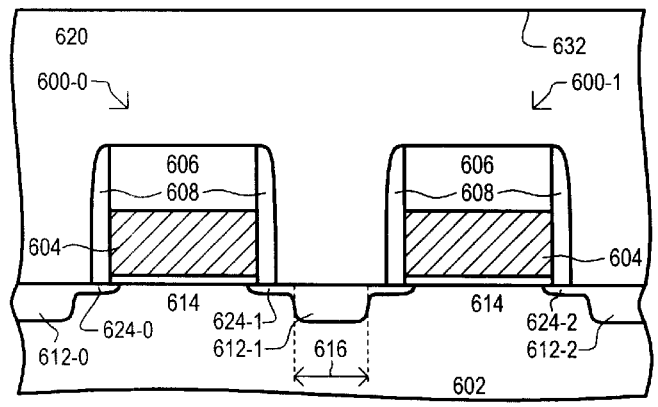

FIG. 6J shows an interlayer dielectric 620 with a planarized surface 632. One particular planarization method may include chemical-mechanical polishing (CMP). It is noted that while CMP may be a preferred planarization method, alternate approaches might be used, including resist etch back approaches, to name but one. In one particular arrangement, a CMP step may remove about 3000 Å of an interlayer dielectric.

Following planarization, a third embodiment 500 may further include a heat treatment step (step 524). Such a heat treatment may repair any damage arising from a deposition of an interlayer dielectric, and in one arrangement may be a RTA step at a temperature in the general range of 800 to 1000° C., more particularly about 950° C. It is noted that such a step may be used for an interlayer dielectric of borophosphosilicate glass (BPSG). However, for a method that includes HDP PSG, a heat treatment step 524 may be omitted.

Figure 6K:
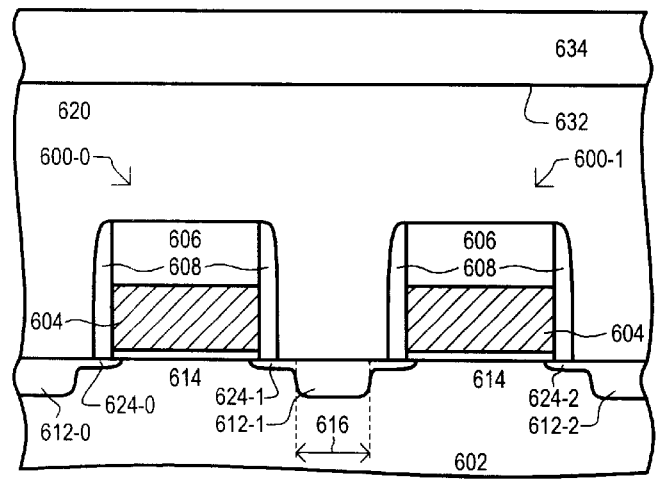

A third embodiment 500 may continue with the formation of a "cap" dielectric (step 526). A cap dielectric may serve to stabilize and/or otherwise protect an underlying interlayer dielectric from moisture or other materials that may affect the reliability of an interlayer dielectric. A semiconductor device following a step 526 is shown in FIG. 6K. In one particular arrangement, a cap dielectric may be undoped silicon dioxide, also referred to herein as undoped silicate glass (USG). In one particular approach, USG may be formed by plasma enhanced CVD (PECVD).

An USG PECVD step may include low frequency power in a general range of 500–800 W, more particularly about 600 W. High frequency power can be in the general range of 300–600 W, more particularly about 400 W. Deposition can occur at a temperature in the general range of 200 to 500° C., more particularly about 350° C., and a pressure in the general range of 1.0 to 3.0 Torr, more particularly about 2.2 Torr. Source materials may include tetraethoxysilane (TEOS) and $O_2$. In one very particular approach, TEOS flows can be in the general range of 1.5–3.0 standard liters per minute (slm), more particularly about 1.8 slm, $O_2$ flows can be in the general range of 3.0–6.0 slm, more particularly about 4.0 slm.

In one embodiment, an USG cap dielectric may be deposited to a thickness in the general range of 1,500 to 3,000 Å, more particularly, about 2,000 Å.

FIG. 6K shows a cap interlayer dielectric 634 formed over an interlayer dielectric 620.

Having formed an interlayer dielectric and a cap dielectric, a third embodiment 500 may form a self-aligned contact etch mask (step 528). Such a step may form an etch mask over an interlayer dielectric having an opening over a desired contact hole location. Because a mask may be a self-aligned contact mask, a contact hole location may not have minimum spacing requirements with adjacent structures. For example, a contact hole mask opening may not have a spacing requirement with respect to a gate structure. A semiconductor device following a step 528 is shown in FIG. 6L.

Figure 6L:
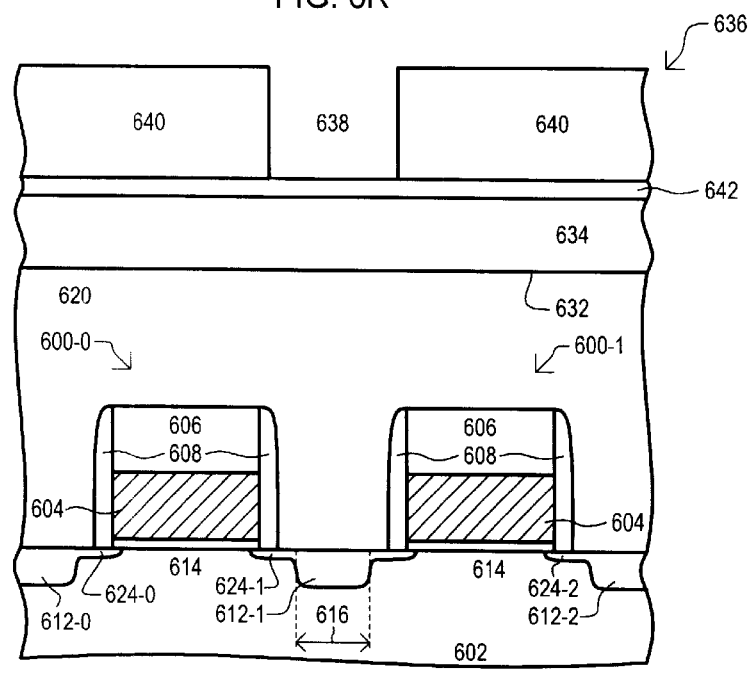

FIG. 6L shows an etch mask 636 formed on a cap dielectric 634. An etch mask 636 may include a mask opening 638 over a desired contact location. A particular etch mask 636 may include a photoresist layer 640 and a bottom antireflective coating (BARC) 642. A photolithography step may be used to form an etch mask.

Once an etch mask has been formed, a contact hole may be formed (step 530). Forming a contact hole may include etching through intermediate layers and exposing a portion of a substrate. A step 530 may include one or more etch steps. In the particular example of FIG. 5, a step 530 may include a first contact etch (step 530-0) and a second contact etch (step 530-1). In a particular arrangement, a first contact etch may clear one portion of a contact hole, while a second contact etch may clear another, or a remaining, portion of a contact hole. A semiconductor device following a step 530-0 is shown in FIG. 6M.

Figure 6M:
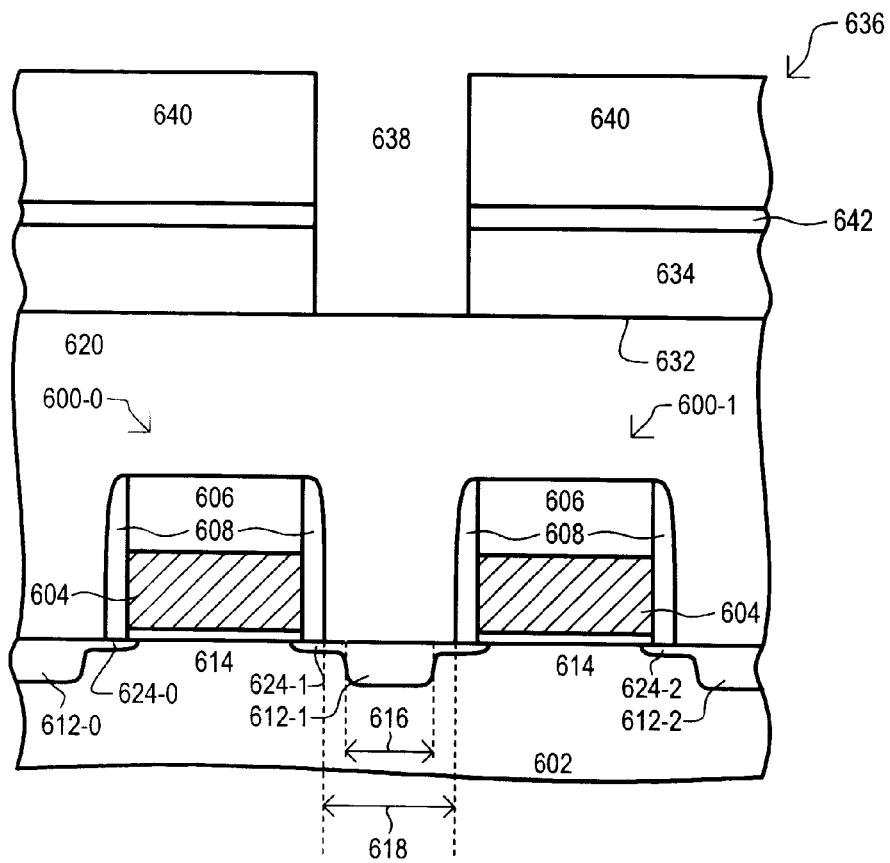

FIG. 6M shows a removal of a portion of a contact hole 622. More particularly, a first contact etch may remove a BARC layer 642 and a cap dielectric 634 at a contact hole location. In one particular arrangement, a first contact etch may be an RIE at an RF Power in the general range of 400 to 800 W, more particularly about 600 W. Etching may be performed at a pressure in the general range of 40–65 mTorr, more particularly 55 mTorr. Etch gases may include one or more reactive gases and one or more inert gases. Reactive gases may include one or more chlori- and/or fluorinated carbon molecules. Such gases may include $CFCl_3$, $CF_2Cl_2$, $CF_3Cl$, $CF_4$, $CHF_3$, $C_2ClF_5$, $C_2F_6$ and/or $C_2H_2F_4$, as just a few examples. In one particular arrangement, a first contact etch may include $CF_4$ and $CHF_3$ and Ar. Flow rates between $CF_4$ and $CHF_3$ may be at a ratio in the range of 3:1 to 7:1, more particularly at a ratio of 5:1, with $CF_4$ flowing at a rate of about 50 sccm and $CHF_3$ flowing at a rate of about 10 sccm. Flow rates between an active gas (or active gases) and Ar may be at a ratio of about 1:2, more particularly, $CF_4$ and $CHF_3$ may flow at a total rate of 60 sccm and Ar may flow at a rate of 125 sccm. For equipment that may cool wafers on chucks, such cooling may be accomplished by He at a pressure of 20 Torr.

Figure 6N:
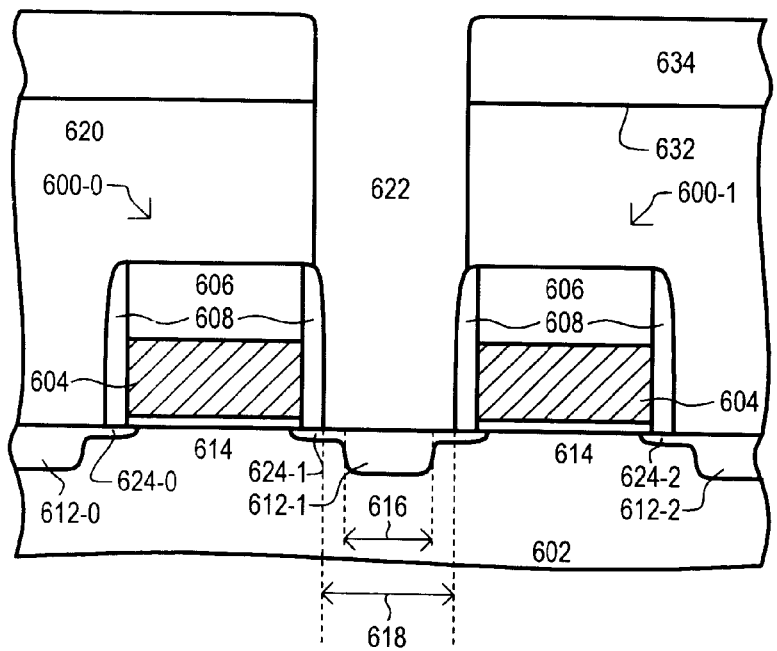

A semiconductor device following a second contact etch step 530-1 is shown in FIG. 6N. It is noted that a second contact etch step 530-1 may retain an etch mask, such as 636, or alternatively, may strip an etch mask 636 and use a cap dielectric 634 as a "hard" etch mask.

FIG. 6N shows a removal of a remaining portion of a contact hole 622. More particularly, a second contact etch may remove an interlayer dielectric 620 and expose a portion of a substrate 602.

In one particular arrangement, a second contact etch may be an RIE at an RF Power in the general range of 200 to 500 W, more particularly about 360 W. Etching may be performed at a pressure in the general range of 40–65 mTorr, more particularly 55 mTorr. As in the case of a first contact hole etch, a second contact hole etch may include one or more reactive gases and one or more inert gases. Reactive gases may include one or more chlori- and/or fluorinated carbon molecules. Such gases may include $CFCl_3$, $CF_2Cl_2$, $CF_3Cl$, $CF_4$, $CHF_3$, $C_2ClF_5$, $C_2F_6$ and/or $C_2H_2F_4$, as just a few examples. In one particular arrangement, a first contact etch may include $CHF_3$, $C_2H_2F_4$ and Ar. Flow rates between $CHF_3$ and $C_2H_2F_4$ may be at a ratio in the range of 15:1 to 7:1, more particularly at a ratio of 10:1, with $CHF_3$ flowing at a rate of about 80 sccm and $C_2H_2F_4$ flowing at a rate of about 8 sccm. Flow rates between an active gas (or active gases) and Ar may be at a ratio in the general range of 2:1 and 1:2, more particularly about 1:1.4, with $CHF_3$ and $C_2H_2F_4$ flowing at a total rate of 88 sccm and Ar may flow at a rate of 125 sccm. For equipment that may cool wafers on chucks, such cooling may be accomplished by He at a pressure of 8 Torr.

Once a contact hole has been formed, a contact may be formed (step 532). Forming a contact may include forming one or more conductive materials in a contact hole. A step 530 may include one or more deposition and/or sputtering steps. In the particular example of FIG. 5, a step 532 may include a forming a liner (step 532-0), alloying a liner (step 532-1) and depositing a contact material (step 532-2). A semiconductor device following a step 530-0 is shown in FIG. 6O.

Figure 6O:
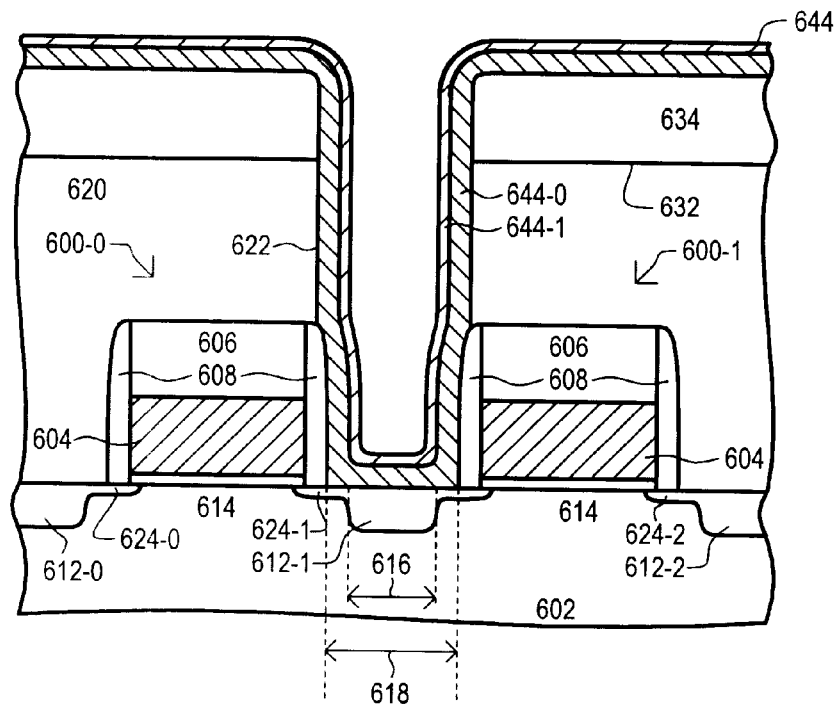

FIG. 6O shows a liner 644 formed over a cap dielectric 634. A liner may include one or more layers. In the example of FIG. 6O, a liner 644 may include a first liner layer 644-0 and a second liner layer 644-1. In one particular arrangement a first liner layer 644-0 may comprise titanium (Ti) while a second liner layer 644-1 may comprise titanium nitride (TiN).

In one particular arrangement, a Ti first liner layer 644-0 may be formed by physical vapor deposition (PVD), also referred to as sputtering. Such a process may be performed at DC power levels in the general range of 3000–5000 W, more particularly about 4000 W and RF power levels in the general range of 2000–3000 W, more particularly about 2500 W. AC bias values may be in the general range of 100–300 volts (V), more particularly 190 V. Ar may be introduced into a chamber at a rate of about 20–30 sccm, more particularly 25 sccm.

In one embodiment, a first liner layer 644-0 may be deposited to a thickness in the general range of 200 to 500 Å, more particularly, about 340 Å.

In one particular arrangement, a TiN second liner layer 644-1 may also be formed by PVD. Such a process may be performed at DC power levels in the general range of 3000–5000 W, more particularly about 4000 W and RF power levels in the general range of 2000–3000 W, more particularly about 2500 W. AC bias values may be in the general range of 100–300 volts (V), more particularly 190 V. Ar may be introduced into a chamber at a rate of about 20–30 sccm, more particularly 25 sccm. A nitrogen source may also be introduced into the chamber. More particularly, nitrogen ($N_2$) may be introduced at a flow rate in the general range of 15–30 sccm, more particularly about 23 sccm.

In one embodiment, a second liner layer 644-1 may be deposited to a thickness in the general range of 200 to 500 Å, more particularly, about 300 Å.

Following the formation of a liner, a liner may be alloyed to a substrate (step 532-1). In one particular arrangement, an alloy step may include an RTA step at a temperature in the general range of 600–700° C., more particularly about 670° C.

A liner can provide a diffusion barrier for a subsequently formed contact material. In addition, a liner may also prevent lifting of a subsequently deposited contact material by providing a surface with improved adhesion for such a material.

Figure 6P:
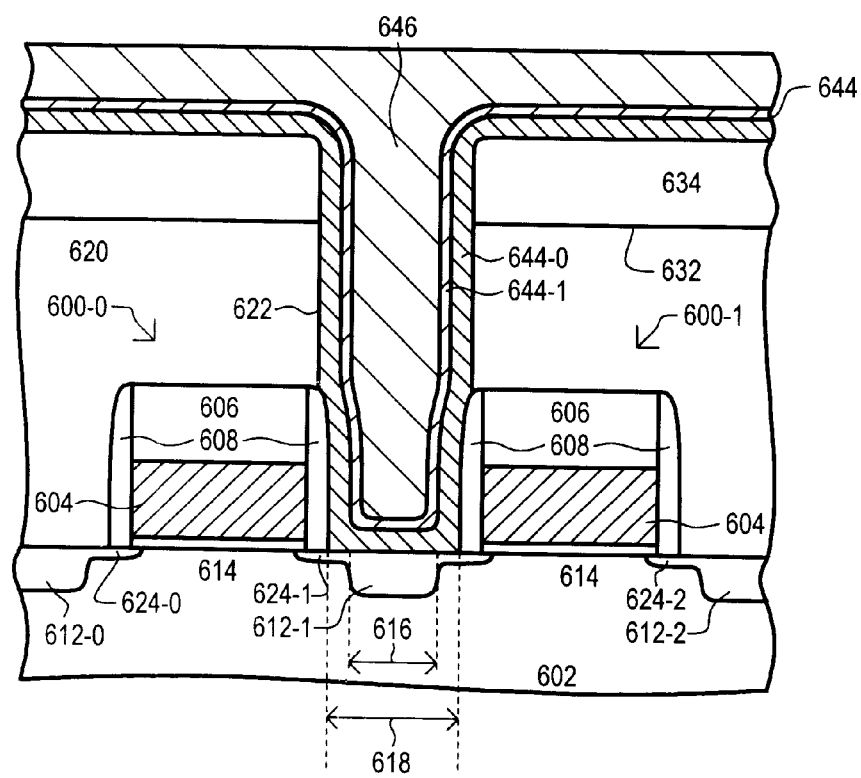

A semiconductor device following a contact formation step 532-2 is shown in FIG. 6P. A conductive contact material 646 has been formed over a liner 644, including within a contact hole 636. In one embodiment, a contact material may comprise tungsten (W) deposited by CVD. More particularly, tungsten CVD step may be performed at a pressure in the general range of about 30–60 Torr, more particularly about 40 Torr. Deposition can occur at a temperature in the general range of about 300–500° C., more particularly about 400° C. Source materials may include tungsten tetrafluoride ($WF_6$). In addition, silane ($SiH_4$) and hydrogen ($H_2$) may be introduced into the chamber during deposition. Flow rates for $WF_6$ may be in the general range of about 0.25 to 0.60 slm, more particularly about 0.45 slm. $SiH_4$ flow rates may be in the general range of about 5 to 20 sccm, more particularly about 15 sccm. $H_2$ flow rates may be in the general range of about 3.0 to 6.0 slm, more particularly about 4.2 slm.

In one embodiment, a conductive contact material 646 may be deposited to a thickness in the general range of 2,000 to 5,000 Å, more particularly, about 3,000 Å.

Having formed a contact to a substrate, a third embodiment 500 may further include planarizing a contact (step 534). A contact planarization step may include a CMP step that removes portions of a conductive contact material 646, and can result in a "plug" type contact. A semiconductor device following a step 534 is shown in FIG. 6Q.

Figure 6Q:
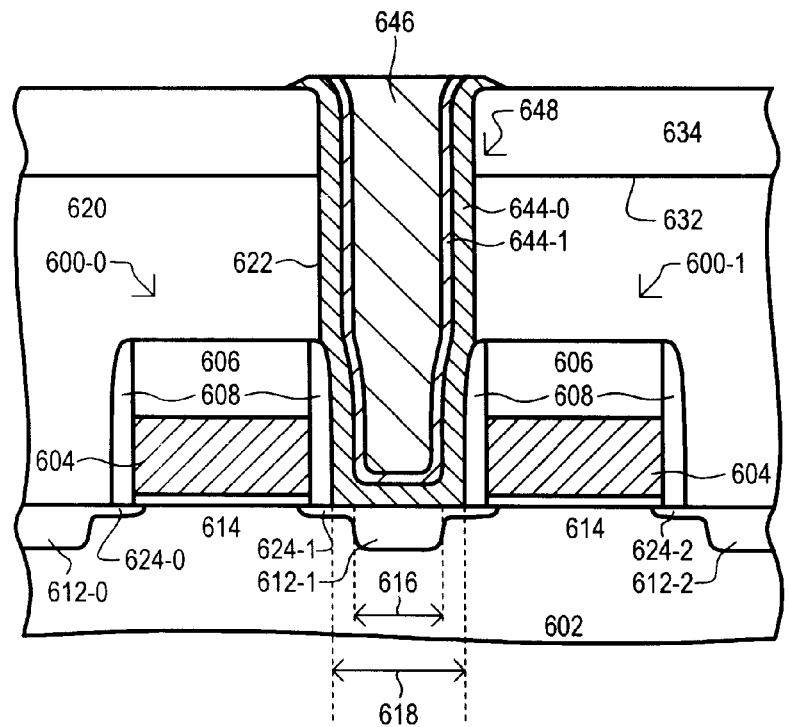

FIG. 6Q shows a contact plug 648 formed through an interlayer dielectric 620 and a cap dielectric 634 to a substrate 602. A CMP process has removed portions of a conductive contact material exposing a cap dielectric 634.

Once a contact has been formed, a third embodiment 500 may form a local interconnect pattern (step 536). An interconnect pattern can provide a conductive path between contacts and or other overlying conductive layers. A step 536 may include forming a local interconnect layer 536-0, a local interconnect mask 536-1 and etching a local interconnect pattern 536-2.

Figure 6R:
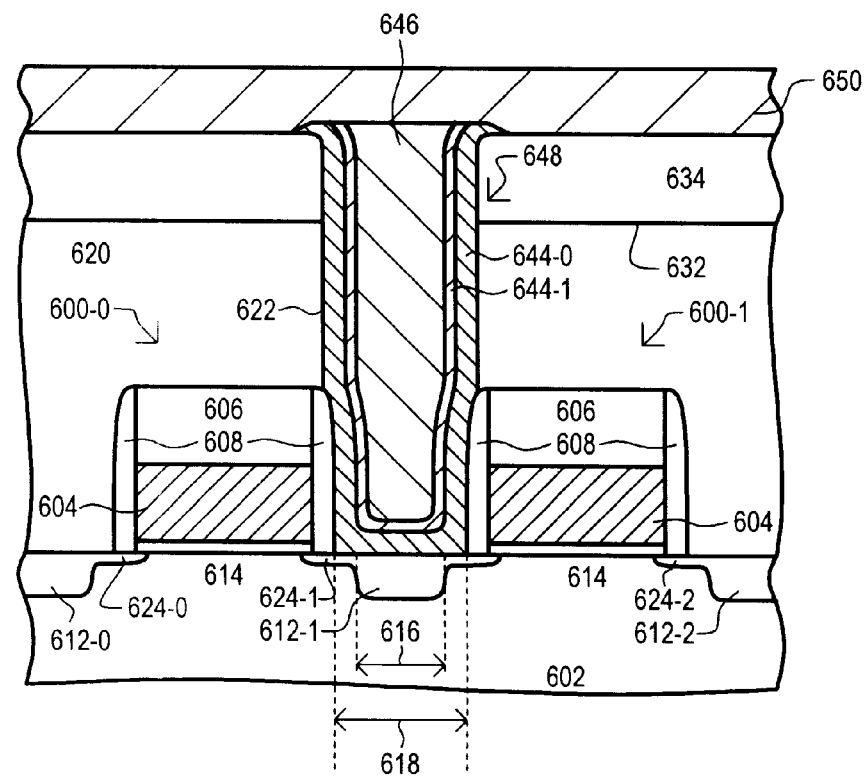

A semiconductor device following a step 536-0 is shown in FIG. 6R. FIG. 6R includes a local interconnect layer 650 formed over a cap dielectric 634 and contact plug 648. In one particular arrangement, a local interconnect layer 650 may include Ti formed by PVD. Such a process may be performed at DC power levels in the general range of about 3000–5000 W, more particularly about 4000 W and RF power levels in the general range of 2000–3000 W, more particularly about 2500 W. AC bias values may be in the general range of 100–300 volts (V), more particularly 190 V. Ar may be introduced into a chamber at a rate of about 20–70 sccm, more particularly about 50 sccm.

In one embodiment, a local interconnect layer 650 may be deposited to a thickness in the general range of 1000 to 3000 Å, more particularly, about 2000 Å.

Figure 6S:
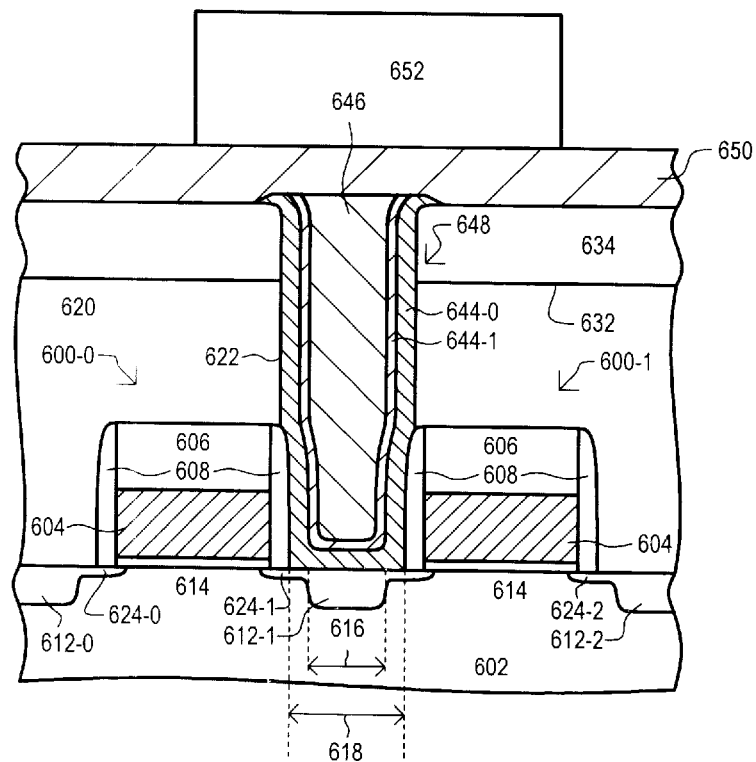

A semiconductor device following a formation of a local interconnect mask (step 536-1) is shown in FIG. 6S. Such a step may form an etch mask over a local interconnect layer corresponding to a desired local interconnect pattern.

FIG. 6S shows an interconnect etch mask 652 formed over a local interconnect layer 650. In one embodiment, an interconnect etch mask 652 may be formed over locations where an interconnect pattern is desired. A particular interconnect etch mask 652 may include a photoresist pattern formed by a photolithography step.

Figure 6T:
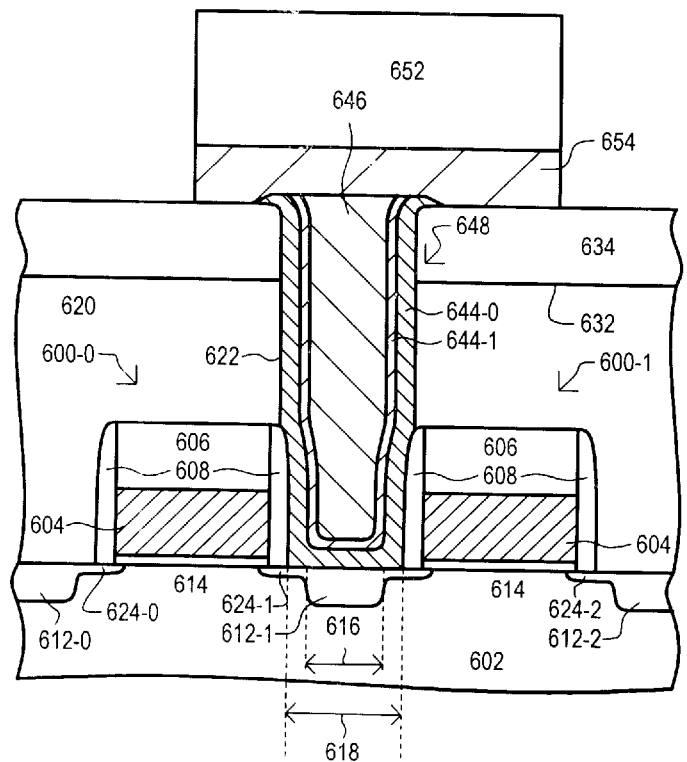
Figure 7A:
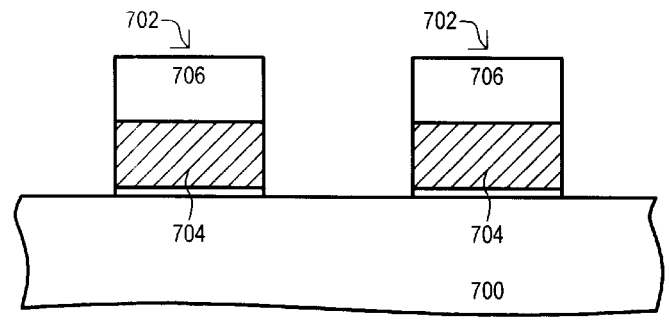
FIGS. 7A to 7F illustrate a conventional method of forming self-aligned contacts.
Figure 7B:
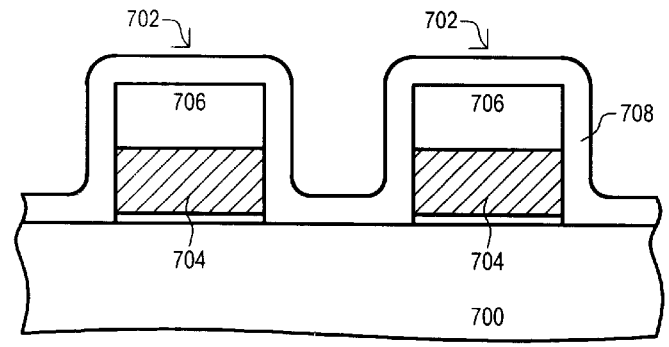
Figure 7C:
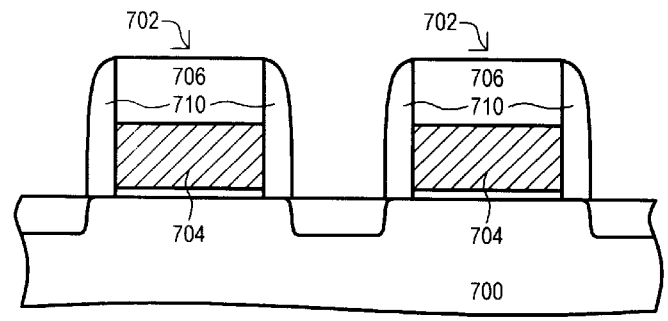
Figure 7D:
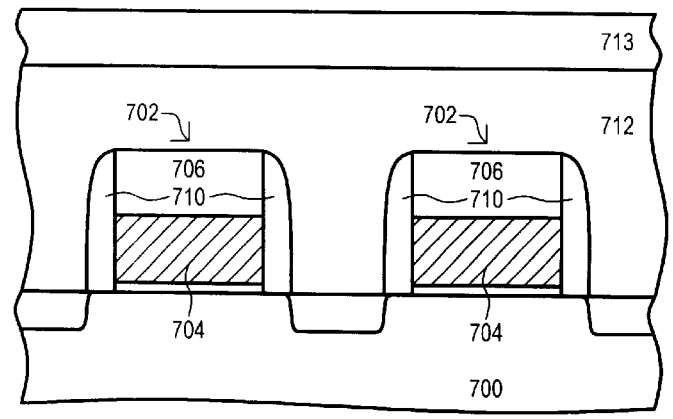
Figure 7E:
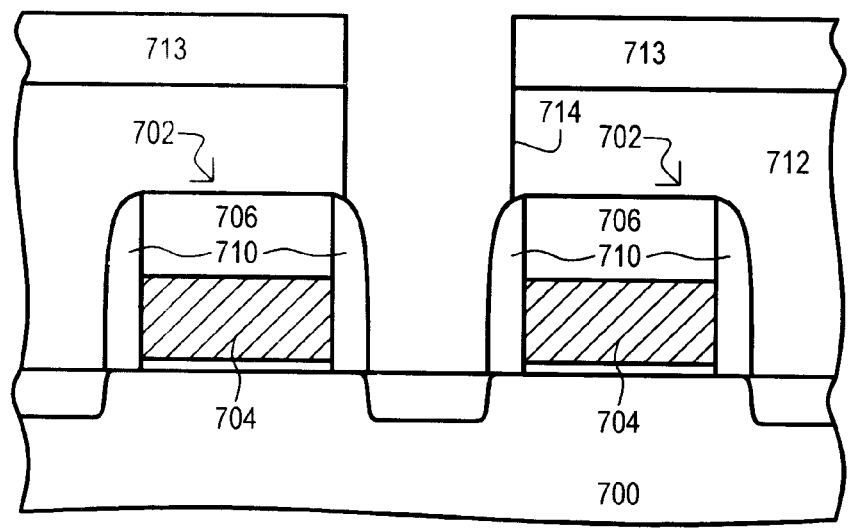
Figure 7F:
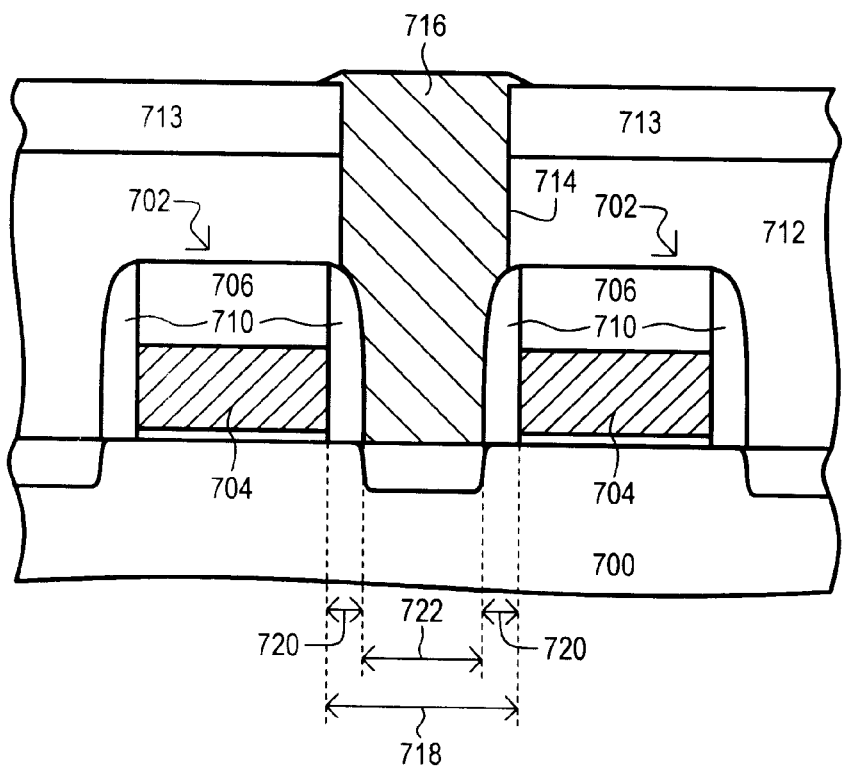

A semiconductor device following the etching of a local interconnect pattern (step 536-2) is shown in FIG. 6T. Such a step may form a local interconnect layer pattern for interconnecting contact with one another and/or to other conducting layers.

FIG. 6T shows a resulting interconnect pattern 654 that may remain after portion of an interconnect layer that are not covered by an interconnect etch mask 652 have been removed.

In one embodiment, etching of a local interconnect pattern may include a reactive ion etch performed at a transformer coupled power in the general range of 200–500 W, more particularly about 360 W. Etching may also include a chamber bias power in the general range of 50–200 W, more particularly 100 W. A reaction chamber can be maintained at a pressure in the general range of about 10–20 mTorr, more particularly about 12 mTorr. Gases used in such an etch may include chlorine ($Cl_2$), boron trichloride ($BCl_3$) and nitrogen ($N_2$). Flow rates for $Cl_2$ and $BCl_3$ may be in the general range of 30–80 sccm, more particularly about 50 sccm. Flow rates for $N_2$ may be in the general range of 0–10 sccm, more particularly about 4 sccm.

In this way, a semiconductor device may be formed having a contact to a transistor source/drain that is self-aligned with respect to a gate structure by a single nitride spacer. A transistor may include source/drain regions that are separated from a channel region by a masking step that includes two spacers as diffusion masks. A contact may further include a liner that may provide a diffusion barrier and/or better adhesion between a contact material and a contact hole surface.

It is understood that while the various embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method, comprising:
forming diffusion regions in a substrate with a diffusion mask that includes a transistor gate structure, a first spacer formed on a side of the transistor gate structure, and a second spacer formed on the first spacer;
removing the second spacer;
after removing the second spacer, forming an interlayer dielectric; and
forming a contact through the interlayer dielectric that is self-aligned with the transistor gate structure.

2. The method of claim 1, wherein:
forming diffusion regions includes ion implanting dopants.

3. The method of claim 2, wherein:
ion implanting dopants includes implanting dopants at a concentration greater than $1 \times 10^{12}/cm^2$.

4. The method of claim 2, wherein:
ion implanting dopants includes implanting dopants at an implantation energy greater than 4 keV.

5. The method of claim 1, wherein:
the second spacer is removed by a substantially isotropic second spacer etch.

6. The method of claim 1, wherein:
the interlayer dielectric comprises high density plasma phosphosilicate glass.

7. The method of claim 1, wherein:
the first spacer comprises silicon nitride and the second spacer comprises silicon dioxide.

8. The method of claim 1, further including:
substantially anisotropically etching a layer of low pressure chemical vapor deposited silicon nitride having a thickness less than 600 angstroms to form a first spacer.

9. The method of claim 1, further including:
substantially anisotropically etching a layer of low pressure chemical vapor deposited silicon dioxide having a thickness less than 600 angstroms to form a second spacer.

10. A method, comprising:
forming second spacers on first spacers formed on sides of a conducting structure, the first spacers comprising silicon nitride;
doping portions of a substrate not covered by the first spacers, second spacers, or conducting structure; and
removing the second spacers prior to depositing an interlayer dielectric over the first spacers.

11. The method of claim 10, wherein:
the conducting structure includes a transistor gate; and
doping portions of a substrate includes forming source and drain regions of an insulated gate field effect transistor.

12. The method of claim 10, wherein:
the second spacers comprise silicon dioxide.

13. The method of claim 12, wherein:
removing the second spacers comprises wet chemically etching the second spacers with a solution comprising buffered hydrofluoric acid.

14. A method, comprising:
forming first spacers comprising silicon nitride on sides of adjacent gate structures formed on a substrate and forming second spacers comprising silicon dioxide on first spacers;
ion implanting dopants into exposed portions of the substrate;
removing the second spacers; and
after removing the second spacers, etching a contact hole through an interlayer dielectric that is self-aligned with the adjacent gate structures.

15. The method of claim 14, wherein:
the adjacent gate structures are separated from one another by distance that is less than 0.5 microns.

16. The method of claim 14, further including:
forming a conductive contact in the contact hole.

17. The method of claim 16, wherein:
forming a conductive contact includes forming a conductive liner layer in the contact hole and forming a contact material on the conductive liner.

18. The method of claim 17, wherein:
the conductive liner comprises titanium.
19. The method of claim 17, wherein:
the conductive liner comprises titanium nitride.

20. The method of claim 17, wherein:
the contact material comprises tungsten.

* * * * *